US012616045B2

(12) United States Patent
Park et al.

(10) Patent No.: US 12,616,045 B2
(45) Date of Patent: Apr. 28, 2026

(54) SEMICONDUCTOR PACKAGE AND METHOD OF FABRICATING THE SAME

(71) Applicant: SAMSUNG ELECTRONICS CO., LTD., Suwon-si (KR)

(72) Inventors: Jong Ho Park, Cheonan-si (KR); Gyu Ho Kang, Cheonan-si (KR); Seong-Hoon Bae, Cheonan-si (KR); Jeong Gi Jin, Seoul (KR); Ju-Il Choi, Seongnam-si (KR); Atsushi Fujisaki, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 847 days.

(21) Appl. No.: 17/814,828

(22) Filed: Jul. 25, 2022

(65) Prior Publication Data

US 2023/0026211 A1        Jan. 26, 2023

(30) Foreign Application Priority Data

Jul. 26, 2021    (KR) ........................ 10-2021-0097554

(51) Int. Cl.
H01L 23/13        (2006.01)
H01L 21/48        (2006.01)
(Continued)

(52) U.S. Cl.
CPC ............ H01L 23/13 (2013.01); H01L 21/563 (2013.01); H01L 21/565 (2013.01);
(Continued)

(58) Field of Classification Search
None
See application file for complete search history.

(56) References Cited

U.S. PATENT DOCUMENTS 8,409,917 B2    4/2013    Yoon et al.
9,379,090 B1    6/2016    Syed et al.
(Continued)

FOREIGN PATENT DOCUMENTS

JP        2002-158326        5/2002
KR    10-2009-0077580        7/2009
(Continued)

OTHER PUBLICATIONS

Liu et al., "Underfill For Ultra-Low Bumped (10Î¼) 3D Package". International Symposium on Microelectronics. 2010. 000786-000791. 10.4071/isom-2010-THA2-Paper1 (Year: 2010).*

(Continued)

*Primary Examiner* — Yara B Green
*Assistant Examiner* — Fakeha Sehar
(74) *Attorney, Agent, or Firm* — MORGAN, LEWIS & BOCKIUS LLP

(57)        ABSTRACT

A semiconductor package includes a wiring structure that includes a first insulating layer and a first conductive pattern inside the first insulating layer, a first semiconductor chip disposed on the wiring structure, an interposer that includes a second insulating layer, a second conductive pattern inside the second insulating layer, and a recess that includes a first sidewall formed on a first surface of the interposer that faces the first semiconductor chip and a first bottom surface connected with the first sidewall, where the recess exposes at least a portion of the second insulating layer, a first element bonded to the interposer and that faces the first semiconductor chip inside the recess, and a mold layer that covers the first semiconductor chip and the first element.

20 Claims, 23 Drawing Sheets

(51) Int. Cl.

| | |
|---|---|
| *H01L 21/56* | (2006.01) |
| *H01L 23/00* | (2006.01) |
| *H01L 23/31* | (2006.01) |
| *H01L 23/498* | (2006.01) |
| *H01L 25/16* | (2023.01) |

(52) U.S. Cl.
CPC .... *H01L 23/3128* (2013.01); *H01L 23/49816* (2013.01); *H01L 23/49822* (2013.01); *H01L 23/49833* (2013.01); *H01L 23/49838* (2013.01); *H01L 25/162* (2013.01); *H01L 25/165* (2013.01); *H01L 21/4857* (2013.01); *H01L 21/486* (2013.01); *H01L 24/16* (2013.01); *H01L 2224/16227* (2013.01); *H01L 2924/1431* (2013.01); *H01L 2924/1436* (2013.01); *H01L 2924/1438* (2013.01); *H01L 2924/19041* (2013.01); *H01L 2924/3511* (2013.01)

(56) References Cited

U.S. PATENT DOCUMENTS

| | | | |
|---|---|---|---|
| 9,478,500 | B2 | 10/2016 | Chen et al. |
| 10,396,037 | B2 | 8/2019 | Hwang et al. |
| 10,510,731 | B2 | 12/2019 | Yu et al. |
| 10,607,971 | B2 | 3/2020 | Im et al. |
| 2012/0104623 | A1* | 5/2012 | Pagaila .................... H01L 23/13 |
| | | | 257/E21.503 |
| 2012/0322202 | A1 | 12/2012 | Nishimura et al. |
| 2016/0056087 | A1* | 2/2016 | Wu ....................... H01L 25/105 |
| | | | 257/738 |
| 2017/0141087 | A1 | 5/2017 | Vincent et al. |
| 2017/0170154 | A1* | 6/2017 | Ryu .................... H01L 23/3128 |
| 2020/0219860 | A1 | 7/2020 | Im et al. |
| 2021/0074600 | A1 | 3/2021 | Jeng et al. |
| 2022/0304147 | A1* | 9/2022 | Kim .................... H05K 1/0296 |

FOREIGN PATENT DOCUMENTS

| | | | | |
|---|---|---|---|---|
| KR | 10-2009-0129318 | A | 12/2009 | |
| KR | 10-1364020 | B1 | 2/2014 | |
| KR | 10-1902137 | B1 | 9/2018 | |
| KR | 10-2019-0042975 | A | 4/2019 | |
| WO | WO-2004073064 | A1 * | 8/2004 | .......... H01L 25/165 |

OTHER PUBLICATIONS

Office Action dated Jul. 9, 2025 issued in Korean Patent Application No. 10-2021-0097554.

* cited by examiner

SEMICONDUCTOR PACKAGE AND METHOD OF FABRICATING THE SAME

CROSS-REFERENCE TO RELATED APPLICATION

This application claims priority under 35 U.S.C. § 119 from Korean Patent Application No. 10-2021-0097554, filed on Jul. 26, 2021 in the Korean Intellectual Property Office, the contents of which are herein incorporated by reference in their entirety.

TECHNICAL FIELD

Embodiments of the present disclosure are directed to a semiconductor package, and more particularly, to a semiconductor package that includes an interposer.

DISCUSSION OF THE RELATED ART

In response to demands for high functionality, high-speed and miniaturization of electronic components, various semiconductor chips may be deposited and packaged on one package wiring structure, or a method of depositing a package on another package may be used. For example, a package-in-package (PIP) type semiconductor package or a package-on-package (POP) type semiconductor package may be used.

A POP type semiconductor package includes an interposer for electrical connection between an upper package and a lower package. The interposer facilitates connection between the upper package and the lower package, and may prevent warpage of the upper package and the lower package from occurring.

SUMMARY

Embodiments of the present disclosure provide a semiconductor package in which a passive element is disposed between an interposer and a semiconductor chip.

According to an embodiment of the present disclosure, there is provided a semiconductor package that includes a wiring structure that includes a first insulating layer and a first conductive pattern inside the first insulating layer, a first semiconductor chip disposed on the wiring structure, an interposer disposed on the first semiconductor chip, where the interposer includes a second insulating layer, a second conductive pattern inside the second insulating layer, and a recess that includes a first sidewall formed on a first surface of the interposer that faces the first semiconductor chip and a first bottom surface connected with the first sidewall, wherein the recess exposes at least a portion of the second insulating layer, a first element bonded to the interposer and that faces the first semiconductor chip inside the recess, and a mold layer that covers the first semiconductor chip and the first element.

According an embodiment of the present disclosure, there is provided a semiconductor package that includes a wiring structure that includes a first insulating layer and a first conductive pattern inside the first insulating layer, a first semiconductor chip disposed on the wiring structure, an interposer disposed on the first semiconductor chip, wherein the interposer includes a second insulating layer, a second conductive pattern inside the second insulating layer, and a multi-stage recess formed on a first surface of the interposer, where the multi-stage recess includes a first stage recess that has a first width, and a second stage recess that is connected to the first stage recess and that has a second width greater than the first width, a first element bonded to the interposer inside the multi-stage recess and that faces the first semiconductor chip; and a first bump connected to the first element positioned in the first stage recess, where an upper surface of the first element is positioned in the second stage recess.

According to an embodiment of the present disclosure, there is provided a semiconductor package that includes a wiring structure that includes a first insulating layer and a first conductive pattern inside the first insulating layer, a first semiconductor chip disposed on the wiring structure, an interposer disposed on the first semiconductor chip, wherein the interposer includes a second insulating layer, a second conductive pattern inside the second insulating layer, and a first recess formed on a first surface of the interposes that faces the first semiconductor chip, a first element disposed inside the first recess and bonded to the interposer, where the first element faces the first semiconductor chip, and a mold layer that fills the first recess and integrally covers a side of the first element.

According to an embodiment of the present disclosure, there is provided a method of fabricating a semiconductor package. The method includes forming a first wiring structure that includes a first insulating layer and a first conductive pattern, and a first semiconductor chip disposed on a first surface of the first wiring structure, forming a second wiring structure that includes a second insulating layer, a second conductive pattern and a first recess on a first surface of the second wiring structure, forming a passive element inside the first recess, forming a connection member that connects the first wiring structure with the second wiring structure, where the first surface of the first wiring structure and the first surface of the second wiring structure face each other, and forming a mold layer that integrally covers the first semiconductor chip and the passive element.

BRIEF DESCRIPTION OF THE DRAWINGS

FIG. 7 is a schematic cross-sectional view of a semiconductor package according to some embodiments, taken along line I-I' of FIG. 4.

FIG. 8 is an enlarged view of a region 51 of FIG. 7.

FIG. 12 is a schematic cross-sectional view of a semiconductor package according to some embodiments, taken along line I-I' of FIG. 4.

FIG. 15 is a schematic cross-sectional view of a semiconductor package according to some embodiments, taken along line II-IF of FIG. 14.

FIG. 16 is a schematic cross-sectional view of a semiconductor package according to some embodiments, taken along line II-IF of FIG. 14.

DETAILED DESCRIPTION

Hereinafter, a semiconductor package according to some embodiments will be described with reference to FIGS. 1 to 6.

Figure 1:
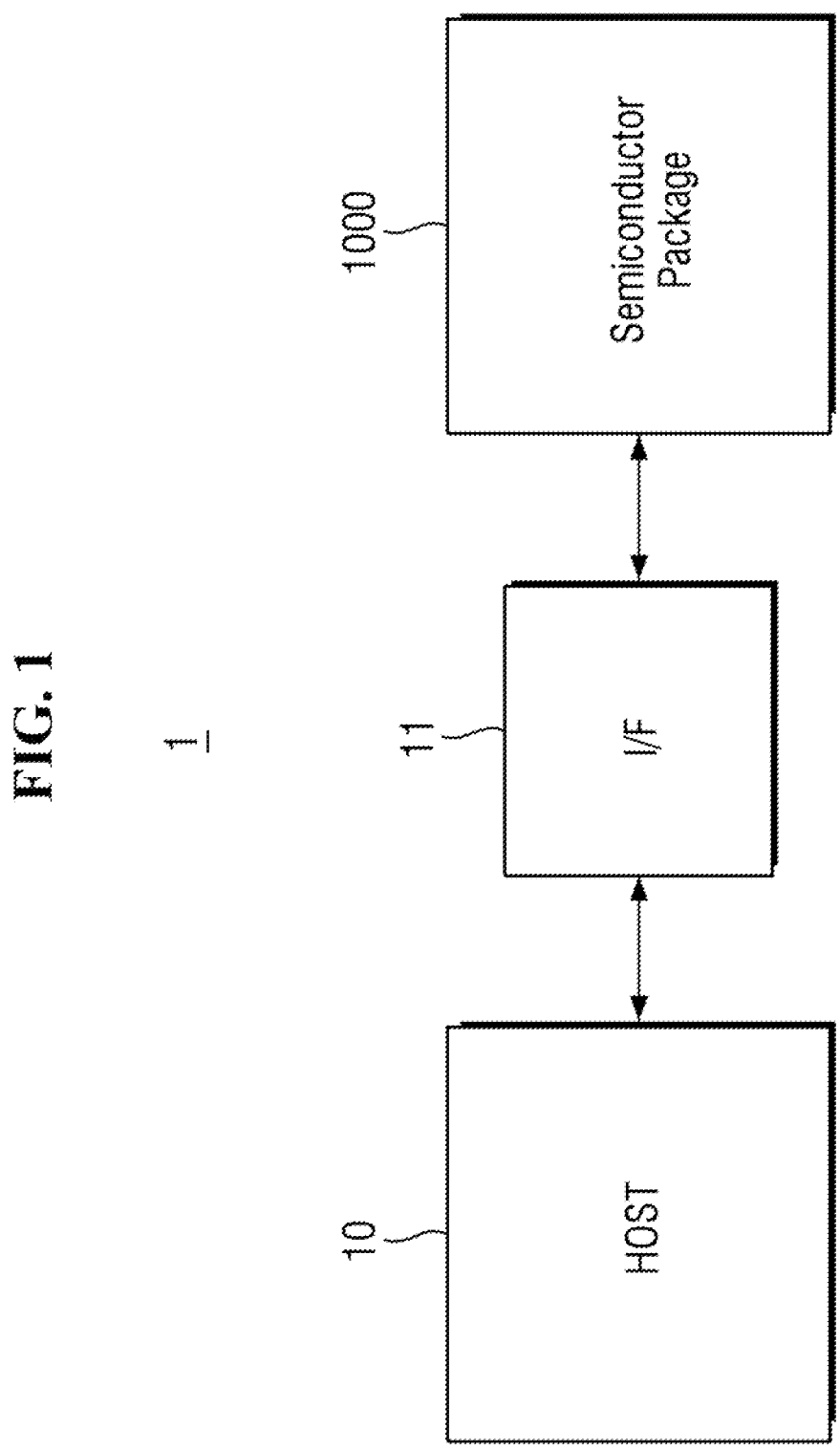
FIGS. 1 and 2 illustrate an electronic device according to some embodiments.
Figure 2:
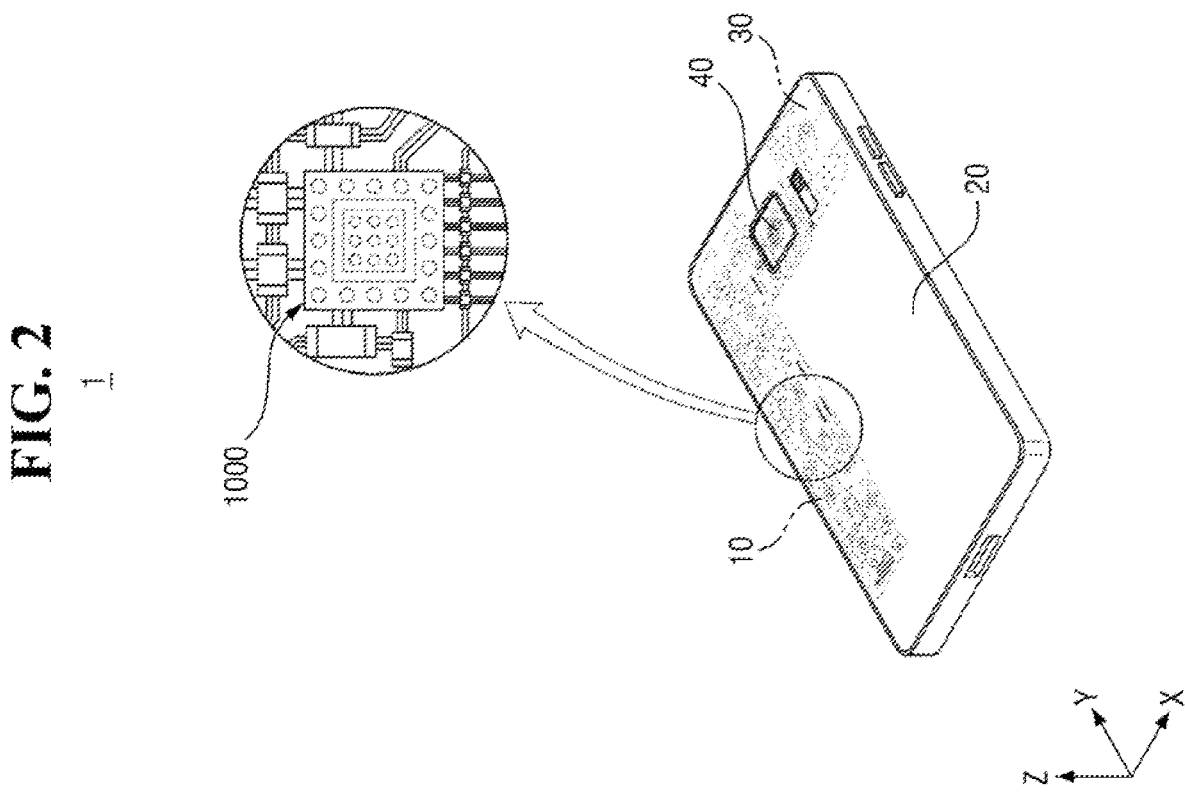
Figure 3:
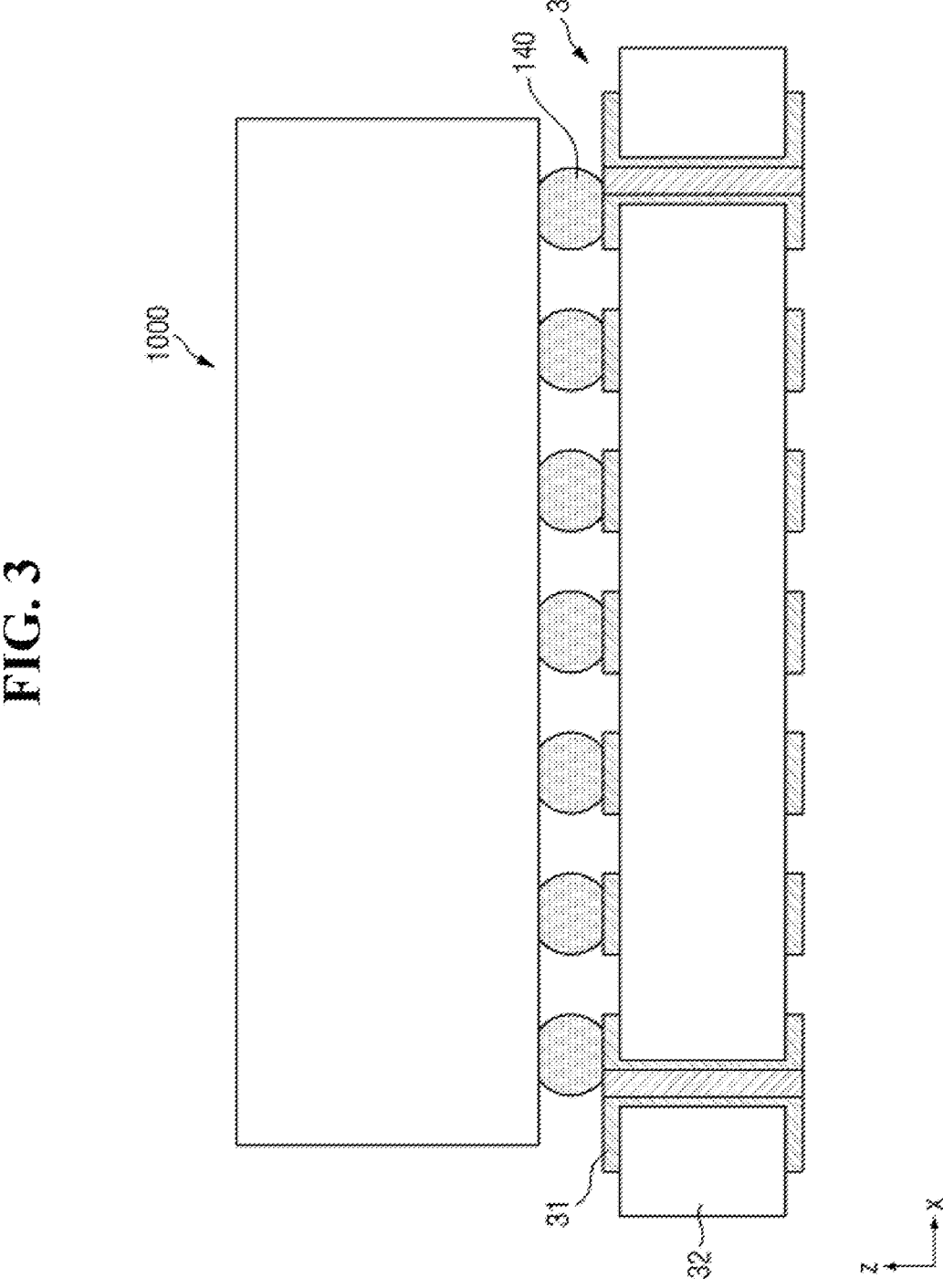
FIG. 3 illustrates a semiconductor package and a main board of FIG. 2.
Figure 4:
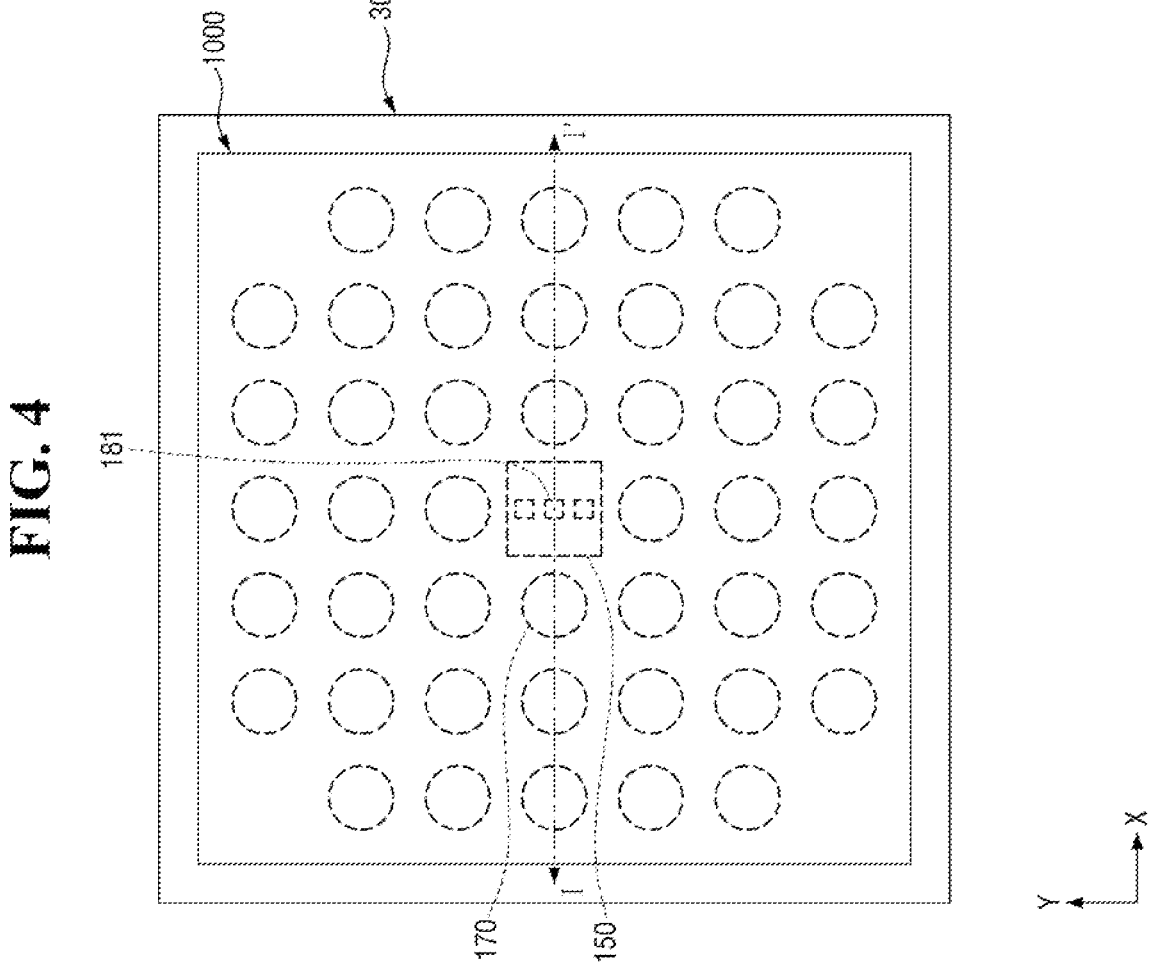
FIG. 4 is a layout view of a semiconductor package according to some embodiments of FIG. 3.
Figure 5:
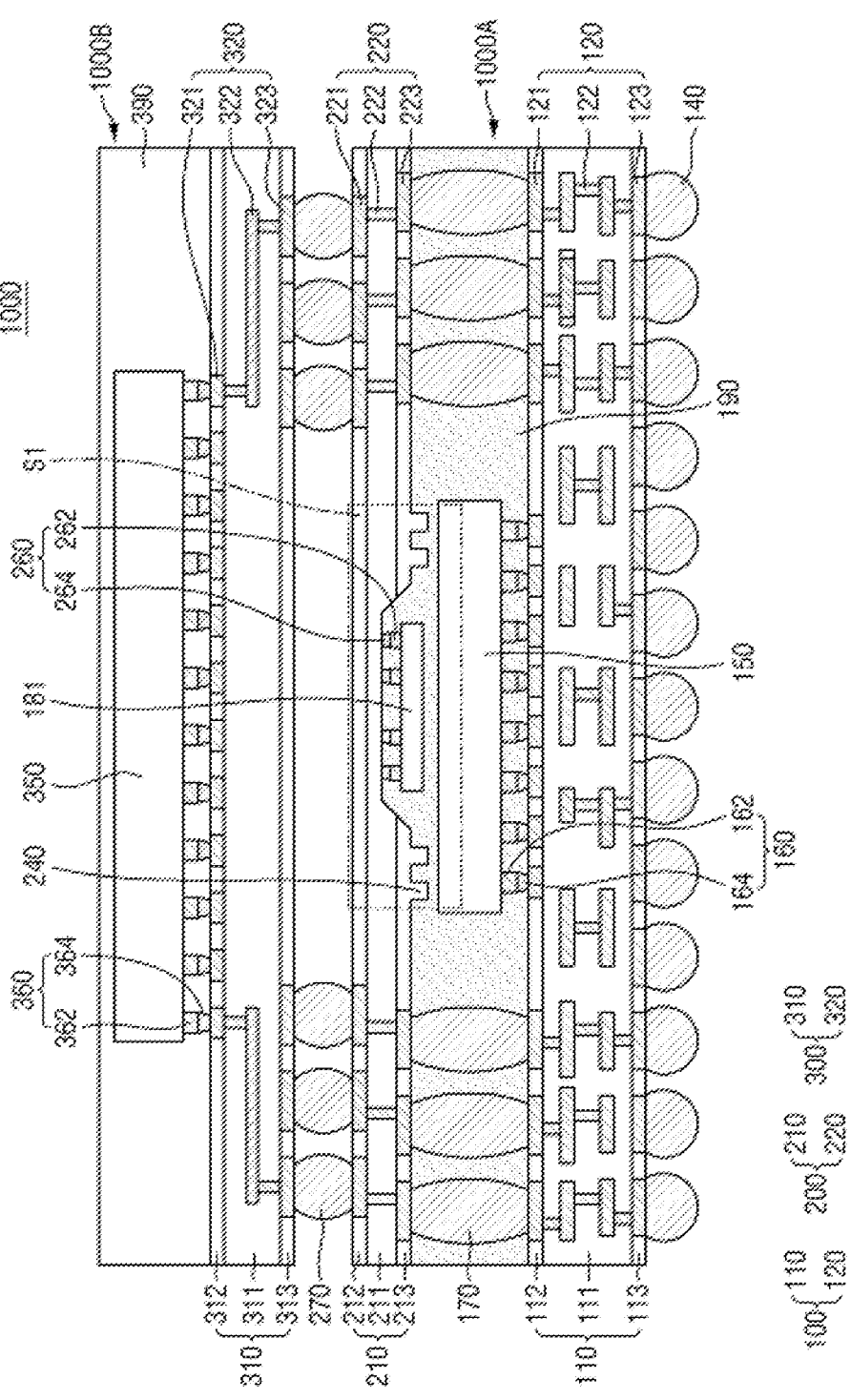
FIG. 5 is a schematic cross-sectional view of a semiconductor package according to some embodiments, taken along line I-I' of FIG. 4.
Figure 6:
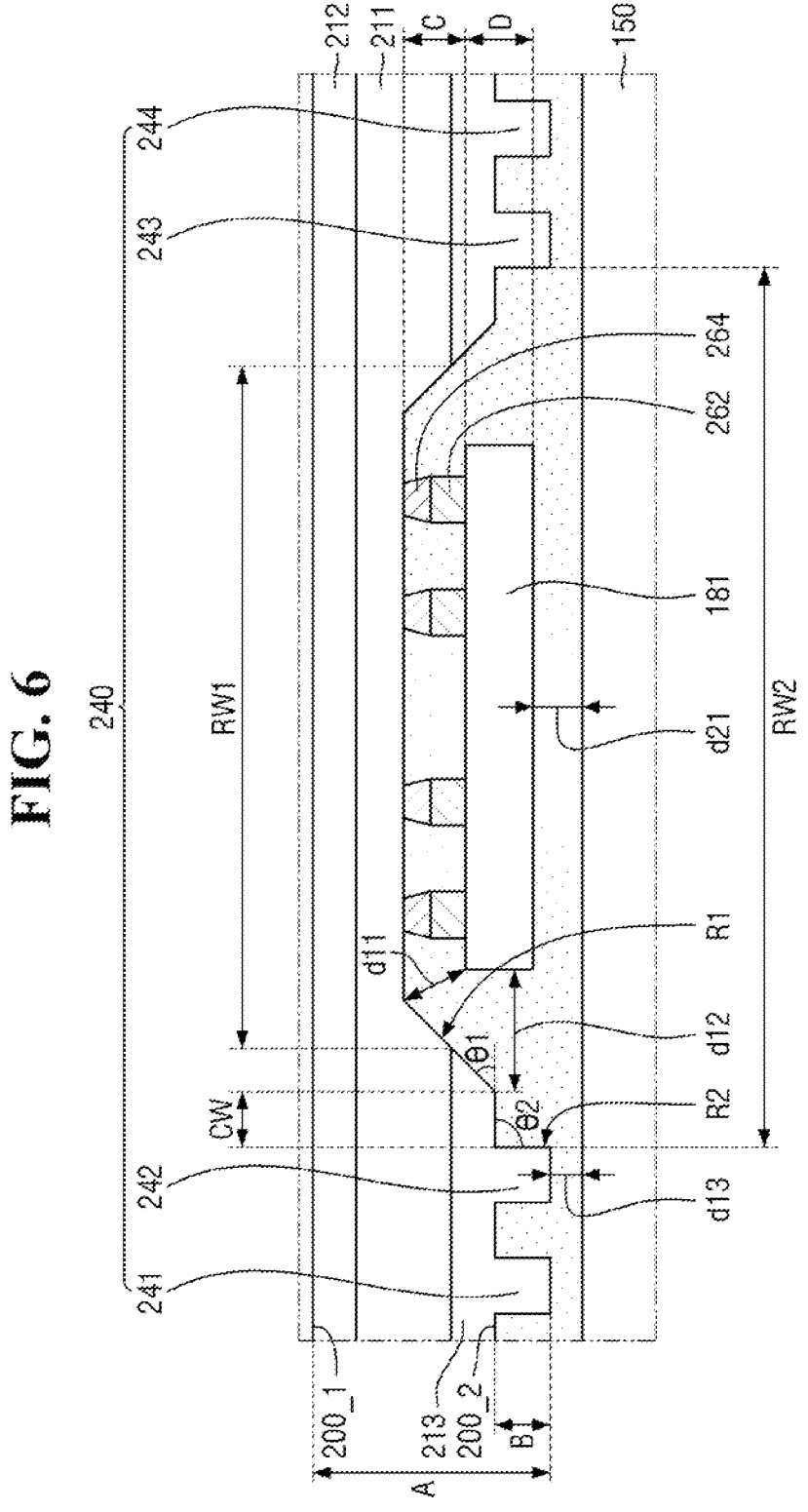
FIG. 6 is an enlarged view of a region 51 of FIG. 5.

FIGS. 1 and 2 illustrate an electronic device according to some embodiments. FIG. 3 illustrates a semiconductor package and a main board of FIG. 2. FIG. 4 is a layout view of a semiconductor package according to some embodiments of FIG. 3. FIG. 5 is a schematic cross-sectional view of a semiconductor package according to some embodiments, taken along line I-I' of FIG. 4. FIG. 6 is an enlarged view of a region 51 of FIG. 5.

Referring to FIG. 1, in an embodiment, an electronic device 1 includes a host 10, an interface 11, and a semiconductor package 1000.

In some embodiments, the host 10 is connected with the semiconductor package 1000 through the interface 11. For example, the host 10 transmits a signal to the semiconductor package 1000 to control the semiconductor package 1000. For example, the host 10 receives a signal from the semiconductor package 1000 to process data in the signal.

For example, the host 10 may include a central processing unit (CPU), a controller, or an application specific integrated circuit (ASIC), but embodiments are not limited thereto. In addition, for example, the host 10 may include a memory chip such as a dynamic random access memory (DRAM), a static RAM (SRAM), a phase-change RAM (PRAM), a magneto-resistive RAM (MRAM), a ferroelectric RAM (FeRAM), or a resistive RAM (RRAM), but embodiments are not limited thereto.

Referring to FIGS. 1 and 2, in an embodiment, the electronic device 1 may include a host 10, a body 20, a main board 30, a camera module 40, and a semiconductor package 1000.

The main board 30 is packaged in the body 20 of the electronic device 1. The host 10, the camera module 40 and the semiconductor package 1000 are packaged on the main board 30. The host 10, the camera module 40 and the semiconductor package 1000 are electrically connected to one another by the main board 30. For example, the interface 11 is implemented by the main board 30.

The host 10 and the semiconductor package 1000 are electrically connected to each other by the main board 30 to transmit and receive signals to and from each other.

Referring to FIG. 3, in an embodiment, the semiconductor package 1000 is disposed on the main board 30. For example, a first connection terminal 140 is disposed on the main board 30. For example, the main board 30 is connected with the semiconductor package 1000 by the first connection terminal 140.

The main board 30 may be one of a printed circuit wiring structure, such as a printed circuit board (PCB), a ceramic wiring structure, a glass wiring structure, or an interposer wiring structure, but embodiments of the present disclosure are not limited thereto. For convenience of description, it is assumed that the main board 30 is a printed circuit wiring structure.

The main board 30 includes a connection structure 31 and a core 32. The core 32 may include a copper clad laminate (CCL), a PPG, an Ajimoto Build-up Film (ABF), an epoxy, a polyimide, etc. The connection structure 31 may include at least one of copper (Cu), aluminum (Al), silver (Ag), tin (Sn), gold (Au), nickel (Ni), lead (Pb), titanium (Ti), or alloy thereof, but embodiments are not limited thereto.

The core 32 is disposed at the center of the main board 30, and the connection structure 31 is disposed at upper and lower portions of the core 32. The connection structure 31 is exposed at the upper and lower portions of the main board 30.

The connection structure 31 also penetrates through the core 32. The connection structure 31 electrically connects elements that are in contact with the main board 30 with each other. For example, the connection structure 31 electrically connects the semiconductor package 1000 with the host 10. That is, the connection structure 31 electrically connects the semiconductor package 1000 with the host 10 through the first connection terminal 140.

Referring to FIG. 5, in an embodiment, a semiconductor package according to some embodiments includes a first semiconductor package 1000A that includes a first wiring structure 100, a first semiconductor chip 150, an interposer 200, a first element 181, and a first mold layer 190. The semiconductor package according to some embodiments further includes a first bump 160, a second bump 260, and a second semiconductor chip 350.

The first wiring structure 100 is a wiring structure for a package. For example, the first wiring structure 100 is a printed circuit wiring structure such as a printed circuit board (PCB) or a ceramic wiring structure. Alternatively, the first wiring structure 100 is a wiring structure for a wafer level package (WLP), which is fabricated at a wafer level. The first wiring structure 100 includes a lower surface and an upper surface that are opposite to each other.

The first wiring structure 100 includes a first insulating layer 110 and a first conductive pattern 120. The first insulating layer 110 includes a first substrate 111, a first lower passivation layer 113, and a first upper passivation layer 112. The first conductive pattern 120 includes a first lower pad 123, a first wiring pattern 122, and a first upper pad 121.

The first substrate 111 may be, for example, a printed circuit board (PCB) or a ceramic substrate, but embodiments of the present disclosure are not limited thereto.

When the first substrate 111 is a printed circuit board, the first insulating layer 110 includes at least one of a phenolic resin, an epoxy resin or a polyimide. For example, the first insulating layer 110 includes at least one of FR-4, tetrafunctional epoxy, polyphenylene ether, epoxy/polyphenylene oxide, bismaleimide triazine (BT), thermount, cyanate ester, polyimide or liquid crystal polymer. A surface of the first substrate 111 is covered by a solder resist. That is, the first lower passivation layer 113 and the first upper passivation layer 112, which are formed on opposite surfaces of the first substrate 111, may be solder resists, but embodiments of the present disclosure are not limited thereto.

The first conductive pattern 120 is disposed inside the first insulating layer 110. The first conductive pattern 120 includes the first wiring pattern 122 that electrically connects the first lower pad 123 with the first upper pad 121. The first wiring pattern 122 includes a plurality of wires, and a plurality of vias that connect the respective wires.

Although the first insulating layer 110 is shown as having a single layer, this is for convenience of description, and embodiments are not limited thereto. For example, in other embodiments, the first insulating layer 110 includes multiple layers that form a multi-layered first conductive pattern 120.

In some embodiments, the first connection terminal 140 is formed on a lower surface of the first wiring structure 100. The first connection terminal 140 is attached to the first lower pad 123. The first connection terminal 140 has spherical or oval shape, but embodiments are not limited thereto. The first connection terminal 140 includes at least one of tin (Sn), indium (In), lead (Pb), zinc (Zn), nickel (Ni), gold (Au), silver (Ag), copper (Cu), antimony (Sb), bismuth (Bi), or combinations thereof, but embodiments of the present disclosure are not limited thereto.

The first connection terminal 140 electrically connects the first wiring structure 100 with an external device. Therefore, the first connection terminal 140 transmits an electrical signal to the first wiring structure 100, or transmits an electrical signal received from the first wiring structure 100 to the external device.

The first upper passivation layer 112 and the first upper pad 121 are formed on an upper surface of the first substrate 111. The first upper passivation layer 112 covers the upper surface of the first substrate 111, and exposes the first upper pad 121.

The first lower passivation layer 113 and the first lower pad 123 are formed on a lower surface of the first substrate 111. The first lower passivation layer 113 covers the lower surface of the first substrate 111, and exposes the first lower pad 123.

In some embodiments, the first upper pad 121 is electrically connected with the first lower pad 123. For example, the first upper pad 121 is in contact with the first wiring pattern 122 and is thus electrically connected with the first lower pad 123.

The first lower passivation layer 113 and the first upper passivation layer 112 may include, but are not limited to, a photoimageable dielectric (PID) material.

The first semiconductor chip 150 is disposed on the first wiring structure 100. For example, the first semiconductor chip 150 is packaged on an upper surface of the first wiring structure 100. The first semiconductor chip 150 is an integrated circuit (IC) that includes hundreds to millions of semiconductor elements integrated into one chip. For example, the first semiconductor chip 150 may be an application processor (AP) such as a central processing unit (CPU), a graphic processing unit (GPU), a field programmable gate array (FPGA), a digital signal processor, an encryption processor, a microprocessor, or a microcontroller, but embodiments are not limited thereto. For example, the first semiconductor chip 150 may be a logic chip such as an analog-to-digital converter (ADC) or an application-specific integrated circuit (ASIC), or may be a memory chip such as a volatile memory such as a DRAM, or a nonvolatile memory such as a ROM or flash memory. In addition, in some embodiments, the first semiconductor chip 150 may be configured by a combination of a logic chip and a memory chip.

Although FIG. 5 shows only one first semiconductor chip 150 formed on the first wiring structure 100, this is for convenience of description, and embodiments are not limited thereto. For example, in other embodiments, a plurality of first semiconductor chips 150 may be formed side by side on the first wiring structure 100, or a plurality of first semiconductor chips 150 may be vertically stacked on the first wiring structure 100.

In some embodiments, the first semiconductor chip 150 is packaged on the first wiring structure 100 by a flip chip bonding method. For example, the first bump 160 is formed between the upper surface of the first wiring structure 100 and a lower surface of the first semiconductor chip 150. The first bump 160 electrically connects the first wiring structure 100 with the first semiconductor chip 150.

The first bump 160 includes, for example, a first pillar layer 162 and a first solder layer 164.

The first pillar layer 162 protrudes from the lower surface of the first semiconductor chip 150. The first pillar layer 162 includes, but is not limited to, at least one of copper (Cu), copper alloy, nickel (Ni), palladium (Pd), platinum (Pt), gold (Au), cobalt (Co), or combination thereof.

The first solder layer 164 connects the first pillar layer 162 with the first wiring structure 100. For example, the first solder layer 164 is connected to some of the first upper pads 121. The first solder layer 164 has spherical or oval shape, but embodiments are not limited thereto. The first solder layer 164 includes, but is not limited to, at least one of tin (Sn), indium (In), bismuth (Bi), antimony (Sb), copper (Cu), silver (Ag), zinc (Zn), lead (Pb), or combinations thereof.

The interposer 200 is interposed between the first wiring structure 100 and a third wiring structure 300. For example, the interposer 200 is disposed on the first wiring structure 100 and the first semiconductor chip 150. In some embodiments, the interposer 200 may be referred to as a second wiring structure 200. The interposer 200 facilitates connection between the first wiring structure 100 and the third wiring structure 300. In addition, the interposer 200 prevents warpage from occurring between the first wiring structure 100 and the third wiring structure 300.

The interposer 200 includes a lower surface and an upper surface that are opposite to each other. For example, the lower surface of the interposer 200 faces the upper surface of the first wiring structure 100, and the upper surface of the interposer 200 faces a lower surface of the third wiring structure 300, which will be described below.

The interposer 200 is spaced apart from the first wiring structure 100. Further, the interposer 200 may be spaced apart from the first semiconductor chip 150. For example, the interposer 200 is spaced above the first wiring structure 100 and above the first semiconductor chip 150.

The interposer 200 includes a second insulating layer 210 and a second conductive pattern 220. The second insulating layer 210 includes a second lower passivation layer 213, a second substrate 211, and a second upper passivation layer 212. The second conductive pattern 220 includes a second lower pad 223, a second wiring pattern 222, and a second upper pad 221.

The second substrate 211 may be, for example, a printed circuit board (PCB) or a ceramic substrate, but embodiments of the present disclosure are not limited thereto. In some embodiments, the interposer 200 includes silicon (Si).

The second conductive pattern 220 is disposed inside the second insulating layer 210. The second conductive pattern 220 includes the second wiring pattern 222 that electrically connects the second lower pad 223 with the second upper pad 221. The second wiring pattern 222 includes a plurality of wires, and a plurality of vias that connect the respective wires.

Although the second insulating layer 210 is shown as having a single layer, this is for convenience of description, and embodiments are not limited thereto. For example, in other embodiments, the second insulating layer 210 includes multiple layers that form a multi-layered second conductive pattern 220.

The second upper passivation layer 212 and the second upper pad 221 are formed on an upper surface of the second substrate 211. The second upper passivation layer 212 covers the upper surface of the second substrate 211, and exposes the second upper pad 221.

The second lower passivation layer 213 and the second lower pad 223 are formed on a lower surface of the second substrate 211. The second lower passivation layer 213 covers the lower surface of the second substrate 211, and exposes the second lower pad 223.

In some embodiments, the second upper pad 221 are electrically connected with the second lower pad 223. For example, the second upper pad 221 is in contact with the second wiring pattern 222 and is thus electrically connected with the second lower pad 223.

The second lower passivation layer 213 and the second upper passivation layer 212 may include, but are not limited to, a photoimageable dielectric (PID) material.

A first connection member 170 is interposed between the first wiring structure 100 and the interposer 200. The first connection member 170 is in contact with the upper surface of the first wiring structure 100 and the lower surface of the interposer 200. The first connection member 170 electrically connects the first wiring structure 100 with the interposer 200. For example, the first connection member 170 is in contact with the first upper pad 121 of the first wiring structure 100 and the second lower pad 223 of the interposer 200. Therefore, the first connection member 170 electrically connects the first conductive pattern 120 with the second conductive pattern 220.

The first connection member 170 may have, for example, a spherical or oval shape, but embodiments are not limited thereto. The first connection member 170 includes, for example, at least one of tin (Sn), indium (In), bismuth (Bi), antimony (Sb), copper (Cu), silver (Ag), zinc (Zn), lead (Pb), or combinations thereof, but embodiments are not limited thereto.

The first element 181 is interposed between the upper surface of the first semiconductor chip 150 and the interposer 200. In this case, heat generated from the first semiconductor chip 150 is emitted from the semiconductor package more effectively than in a case in which the first mold layer 190, which will be described below, is filled only between the upper surface of the first semiconductor chip 150 and the interposer 200.

In some embodiments, the first element 181 is a passive element. In some embodiments, the first element 181 is a capacitor of the passive element. In some embodiments, a thickness D of the first element 181 is about 20 μm to 100 μm.

The first element 181 supplies a power signal received from the main board 30, on which the first semiconductor chip 150 is packaged, to the second semiconductor chip 350, which will be described below, through the second bump 260, which will be described below. As the first element 181 is disposed between the first semiconductor chip 150 and the interposer 200, the first element 181 can support the inside of the semiconductor package. In addition, as the first element 181 is disposed inside the first mold layer 190, which will be described below, an interval between the first connection terminals 140 of the semiconductor package is reduced.

The first mold layer 190 is formed on the first wiring structure 100. The first mold layer 190 fills a space between the first wiring structure 100 and the interposer 200. Therefore, the first mold layer 190 covers and protects the first wiring structure 100, the first semiconductor chip 150, the first bump 160, the second bump 260 and the first connection member 170. The first connection member 170 electrically connects the first wiring structure 100 with the interposer 200 by passing through the first mold layer 190. That is, the first mold layer 190 covers a side of the first semiconductor chip 150, and is in contact with a side of the first element 181.

The first mold layer 190 includes, for example, an insulating polymer material such as an epoxy molding compound (EMC). The first mold layer 190 includes a thermosetting resin such as an epoxy resin, a thermoplastic resin such as polyimide, or a resin that includes a reinforcing material such as a filler, such as ABF, FR-4, BT resin, etc. The filler includes at least one of $SiO_2$, $Al_2O_3$, $SiC$, $BaSO_4$, talc, mud, mica powder, $Al(OH)_3$, $Mg(OH)_2$, $CaCO_3$, $MgCO_3$, $MgO$, $BN$, $AlBO_3$, $BaTiO_3$ or $Ca_7rO_3$, but the material of the filler is not limited thereto. The filler may include a metal and/or an organic material.

The interposer 200 includes a first recess R1 that includes a first sidewall formed on a first surface 200_2 that faces the first semiconductor chip 150 and that exposes at least a portion of the second insulating layer 210, and a first bottom surface connected with the first sidewall. The second bump 260 is connected with the first element 181 and is positioned in the first recess R1. The second bump electrically connects the interposer 200 with the first element 181.

The second bump 260 includes, for example, a second pillar layer 262 and a second solder layer 264. The second pillar layer 262 protrudes from the upper surface of the first element 181. The second solder layer 264 connects the second pillar layer 262 with the second substrate 211. For example, the second solder layer 264 is connected to a portion of the second lower pads 223. The second solder layer 264 has spherical or oval shape, but embodiments are not limited thereto. The mold layer 190 integrally covers a side of the second bump 260.

The materials of the second pillar layer 262 are substantially the same as those of the first pillar layer 162, and the materials of the second solder layer 264 are substantially the same as those of the first solder layer 164.

Referring to FIG. 6, in an embodiment, the interposer 200 further includes a second surface 200_1 that faces the first surface 200_2, and a width RW1 of the first recess R1 decreases toward the second surface 200_1. The first recess R1 includes a first portion that passes through the second lower passivation layer 213 and a second portion formed in the second substrate 211. For example, the first recess R1 is formed in at least a portion of the second substrate 211.

The interposer 200 includes a second recess R2 that includes a second sidewall that protrudes from the first surface 200_2 of the interposer 200, and a second bottom surface connected with the second sidewall. The first mold layer 190 fills a space between the second sidewall and the second bottom surface.

The second recess R2 is connected with the first recess R1 and has a second width RW2 that is greater than a first width RW1 of the first recess R1. An upper surface of the first element 181 is positioned in the second recess R2. In an embodiment, the second recess R2 surrounds the first recess R1, and the first recess R1 is formed within the second recess R2.

Referring to FIG. 6, in an embodiment, a slope of the first sidewall of the first recess R1 and a slope of the second sidewall of the second recess R2 differ from each other. In some embodiments, the slope of the first sidewall of the first recess R1 forms an acute angle θ1 with a surface parallel with the first surface 200_2 of the interposer 200. In addition, the slope of the second sidewall of the second recess R2 forms an acute angle θ2 with the surface parallel with the first surface 200_2 of the interposer 200.

For example, the angle θ2 of the second sidewall of the second recess R2 is greater than the angle θ1 of the first sidewall of the first recess R1. As a result, the first mold layer 190 can more effectively fill the first recess R1, but embodiments are not limited thereto.

Referring to FIG. 6, in an embodiment, a distance C from the bottom surface of the first recess R1 to the first element 181 is ½ times or more of an average particle diameter of the filler. In this case, the distance C from the bottom surface of the first recess R1 to the first element 181 is 8% or more of a thickness A of the interposer 200, but embodiments are not limited thereto. As a result, the first mold layer 190 can more effectively fill a space between the first recess R1 and the first element 181.

The interposer 200 further includes a protrusion 240 on the first surface 200_2 that protrudes toward the first semiconductor chip 150. A thickness B of the protrusion 240 is less than a thickness D of the first element 181. For example, the thickness B of the protrusion 240 is about 25% of the thickness D of the first element 181. For example, the thickness D of the first element 181 is about 60% of the thickness A of the interposer 200. For example, the thickness B of the protrusion 240 is at least about 15% of the thickness A of the interposer 200, but embodiments are not limited thereto.

The protrusion 240 includes a plurality of protrusions 240. The protrusion 240 includes first to fourth protrusion patterns 241, 242, 243 and 244 spaced apart from one another in a direction parallel with the first surface 200_2 of the interposer 200, but embodiments are not limited thereto. The first mold layer 190 fills spaces between the first to fourth protruding patterns 241, 242, 243 and 244.

Referring to FIG. 6, in an embodiment, the first surface 200_2 of the interposer 200 includes a connection surface that connects the first recess R1 with the protrusion 240. For example, a width CW of the connection surface is greater than ⅓ of the thickness B of the protrusion 240 and less than twice the thickness B of the protrusion 240, but embodiments are not limited thereto. As a result, the mold layer 190 more effectively fills the first recess R1 from the second recess R2.

Referring to FIG. 6, in an embodiment, a shortest distance between an edge of the first element 181 and an edge that connects the first sidewall with the first bottom surface of the first recess R1 is a first distance d11. A shortest distance between the side of the first element 181 and the connection surface is a second distance d12. A shortest distance from the protrusion 240 to the upper surface of the first semiconductor chip 150 is a third distance d13.

The third distance d13 is equal to or less than the first distance d11 and is equal to or less than the second distance d12. The second distance d12 is greater than the first distance d11. As a result, the mold layer 190 more effectively fills the first recess R1 from the second recess R2.

The third distance d13 is less than or equal to a distance d21 from the first element 181 to the upper surface of the first semiconductor chip 150. As a result, a collision between the first semiconductor chip 150 and the first element 181 is avoided.

Referring to FIG. 5, a semiconductor package according to some embodiments further includes a second semiconductor package 1000B that includes a second semiconductor chip 350 packaged in the third wiring structure 300 on the first semiconductor package 1000A.

The third wiring structure 300 is disposed on the upper surface of the interposer 200. The third wiring structure 300 is a wiring structure for a package. For example, the third wiring structure 300 is a printed circuit wiring structure such as a printed circuit board (PCB) or a ceramic wiring structure. Alternatively, the third wiring structure 300 is a wiring structure for a wafer level package (WLP) that is fabricated at a wafer level. The third wiring structure 300 includes a lower surface and an upper surface that are opposite to each other.

The third wiring structure 300 includes a third insulating layer 310 and a third conductive pattern 320. The third insulating layer 310 includes a third substrate 311, a third lower passivation layer 313, and a third upper passivation layer 312. The third conductive pattern 320 includes a third lower pad 323, a third upper pad 321 and a third wiring pattern 322.

The third substrate 311 may be, for example, a printed circuit board (PCB) or a ceramic substrate, but embodiments of the present disclosure are not limited thereto.

When the third substrate 311 is a printed circuit board, the third substrate 311 includes a phenolic resin, an epoxy resin or polyimide. For example, the third substrate 311 includes at least one of FR-4, tetrafunctional epoxy, polyphenylene ether, epoxy/polyphenylene oxide, bismaleimide triazine (BT), thermount, cyanate ester, polyimide or liquid crystal polymer.

A surface of the third substrate 311 is covered by a solder resist. That is, the third lower passivation layer 313 and the third upper passivation layer 312, which are formed on the surfaces of the third substrate 311, are solder resists, but embodiments of the present disclosure are not limited thereto.

The third conductive pattern 320 is disposed inside the third insulating layer 310. The third conductive pattern 320 includes the third wiring pattern 322 for electrically connecting the third lower pad 323 with the third upper pad 321. The third wiring pattern 322 includes a plurality of wires and a plurality of vias that connect the respective wires.

Although the third insulating layer 310 is shown as having a single layer, this is for convenience of description, and embodiments are not limited thereto. For example, in other embodiments, the third insulating layer 310 includes multiple layers that form a multi-layered third conductive pattern 320.

The third upper passivation layer 312 and the third upper pad 321 are formed on an upper surface of the third substrate 311. The third upper passivation layer 312 covers the upper surface of the third substrate 311, and exposes the third upper pad 321.

The third lower passivation layer 313 and the third lower pad 323 are formed on a lower surface of the third substrate 311. The third lower passivation layer 313 covers the lower surface of the third substrate 311, and exposes the third lower pad 323.

In some embodiments, the third upper pad 321 is electrically connected with the third lower pad 323. For example, the third upper pad 321 is in contact with the third wiring pattern 322 and is thus electrically connected with the third lower pad 323.

The third lower passivation layer 313 and the third upper passivation layer 312 include, but are not limited to, a photoimageable dielectric (PID) material.

A second connection member 270 is interposed between the interposer 200 and the third wiring structure 300. The second connection member 270 is in contact with the upper surface of the interposer 200 and the lower surface of the third wiring structure 300. The second connection member 270 electrically connects the interposer 200 with the third wiring structure 300. For example, the second connection member 270 is in contact with the second upper pad 221 of the interposer 200 and the third lower pad 323 of the third wiring structure 300.

The second connection member 270 has a spherical or oval shape, but embodiments are not limited thereto. The second connection member 270 includes at least one of tin (Sn), indium (In), lead (Pb), zinc (Zn), nickel (Ni), gold (Au), silver (Ag), copper (Cu), antimony (Sb), bismuth (Bi) or combinations thereof, but embodiments of the present disclosure are not limited thereto.

The second semiconductor chip 350 is disposed on the third wiring structure 300. For example, the second semiconductor chip 350 is packaged on the upper surface of the third wiring structure 300. The second semiconductor chip 350 is an integrated circuit (IC) that includes hundreds to millions of semiconductor elements integrated into one chip.

In some embodiments, the first semiconductor chip 150 is a logic chip such as an application processor (AP), and the second semiconductor chip 350 is a memory chip such as a volatile memory, such as a DRAM, or a nonvolatile memory, such as a ROM or a flash memory.

Although FIG. 5 shows only one second semiconductor chip 350 formed on the third wiring structure 300, this is for convenience of description, and embodiments are not limited thereto. For example, in other embodiments, a plurality of second semiconductor chips 350 are formed side by side on the third wiring structure 300, or a plurality of second semiconductor chips 350 are sequentially stacked on the third wiring structure 300.

In some embodiments, the second semiconductor chip 350 is packaged on the third wiring structure 300 by a flip chip bonding method. For example, a third bump 360 is formed between the upper surface of the third wiring structure 300 and a lower surface of the second semiconductor chip 350. The third bump 360 electrically connects the third wiring structure 300 with the second semiconductor chip 350.

The third bump 360 includes, for example, a third pillar layer 362 and a third solder layer 364. Since the third pillar layer 362 and the third solder layer 364 are similar to the first pillar layer 162 and the first solder layer 164, their detailed description will be omitted.

In some embodiments, a second mold layer 390 is formed on the third wiring structure 300. The second mold layer 390 covers and protects the third wiring structure 300, the second semiconductor chip 350 and the second bump 360. The second mold layer 390 includes, but is not limited to, an insulating polymer material such as EMC.

The first element 181 is not in physical contact with the second semiconductor package 1000B. As described above, after the first element 181 is formed inside the first semiconductor package 1000A, the second semiconductor package 1000B is formed on the first semiconductor package 1000A. Therefore, the second semiconductor package 1000B and the first element 181 are not physically or directly in contact with each other.

Hereinafter, a semiconductor package according to some embodiments of the present disclosure will be described with reference to FIGS. 7 to 10. For convenience of description, the following will be based on differences from a semiconductor package shown in FIGS. 1 to 6.

Figure 7:
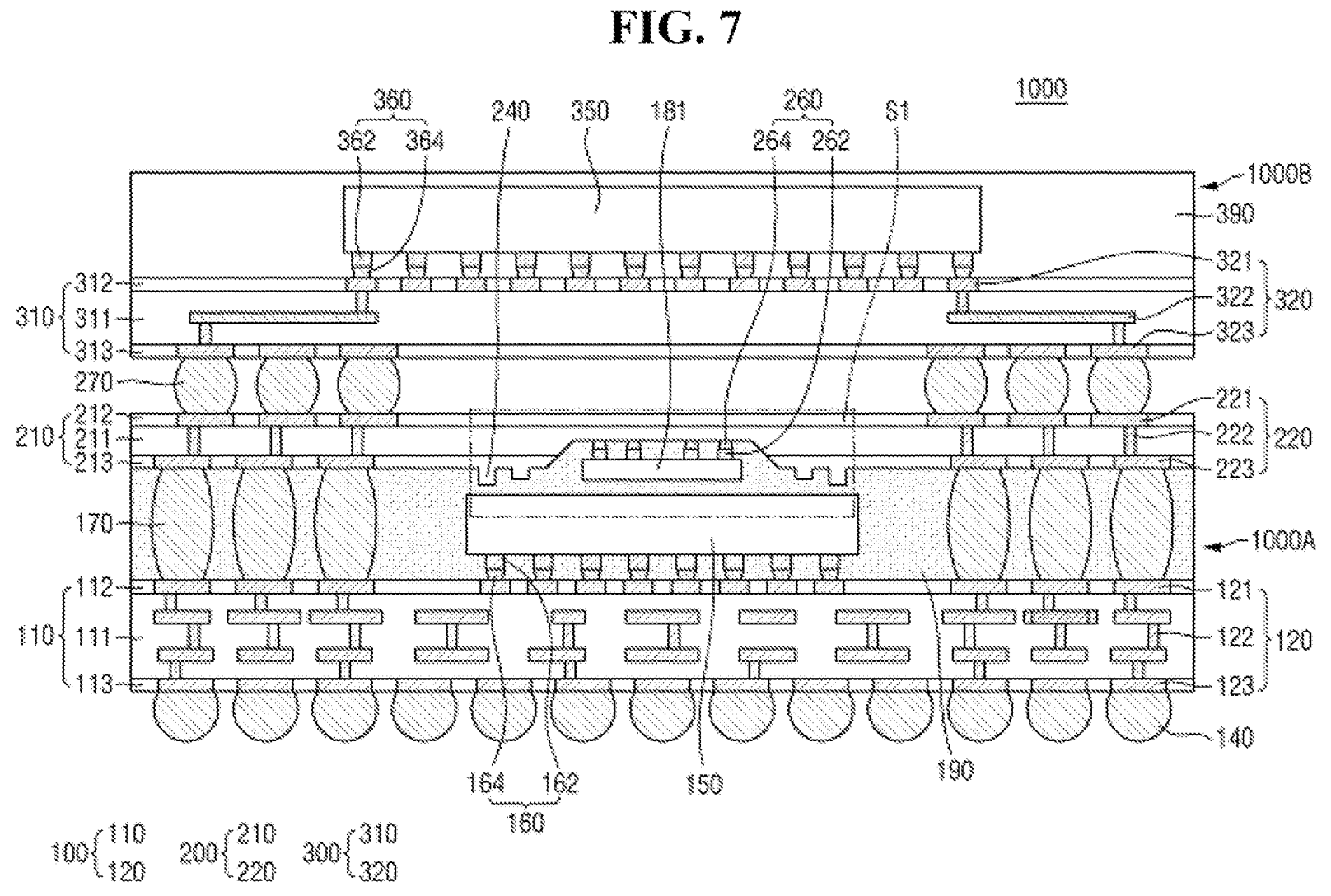
Figure 8:
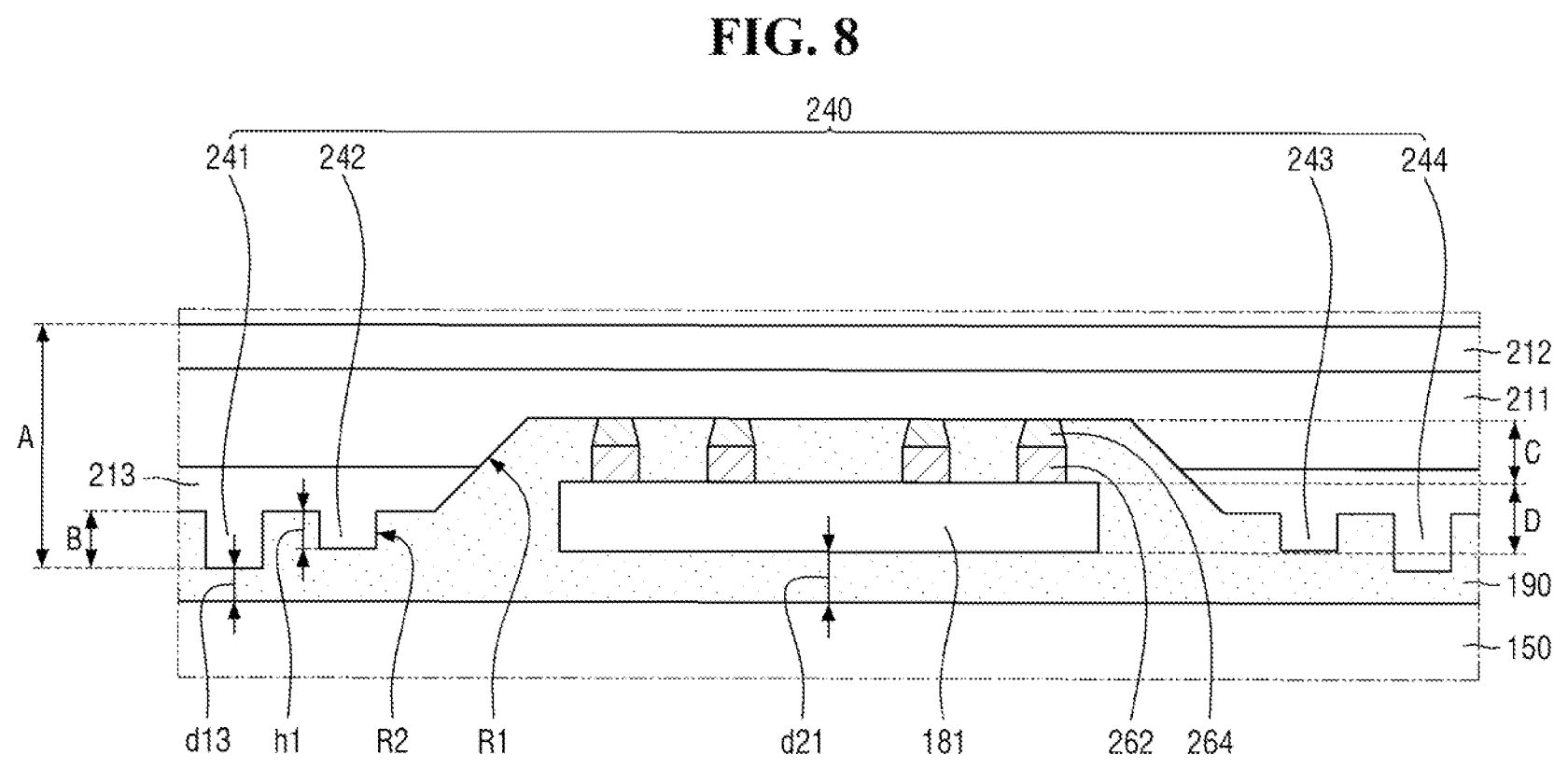
Figure 9:
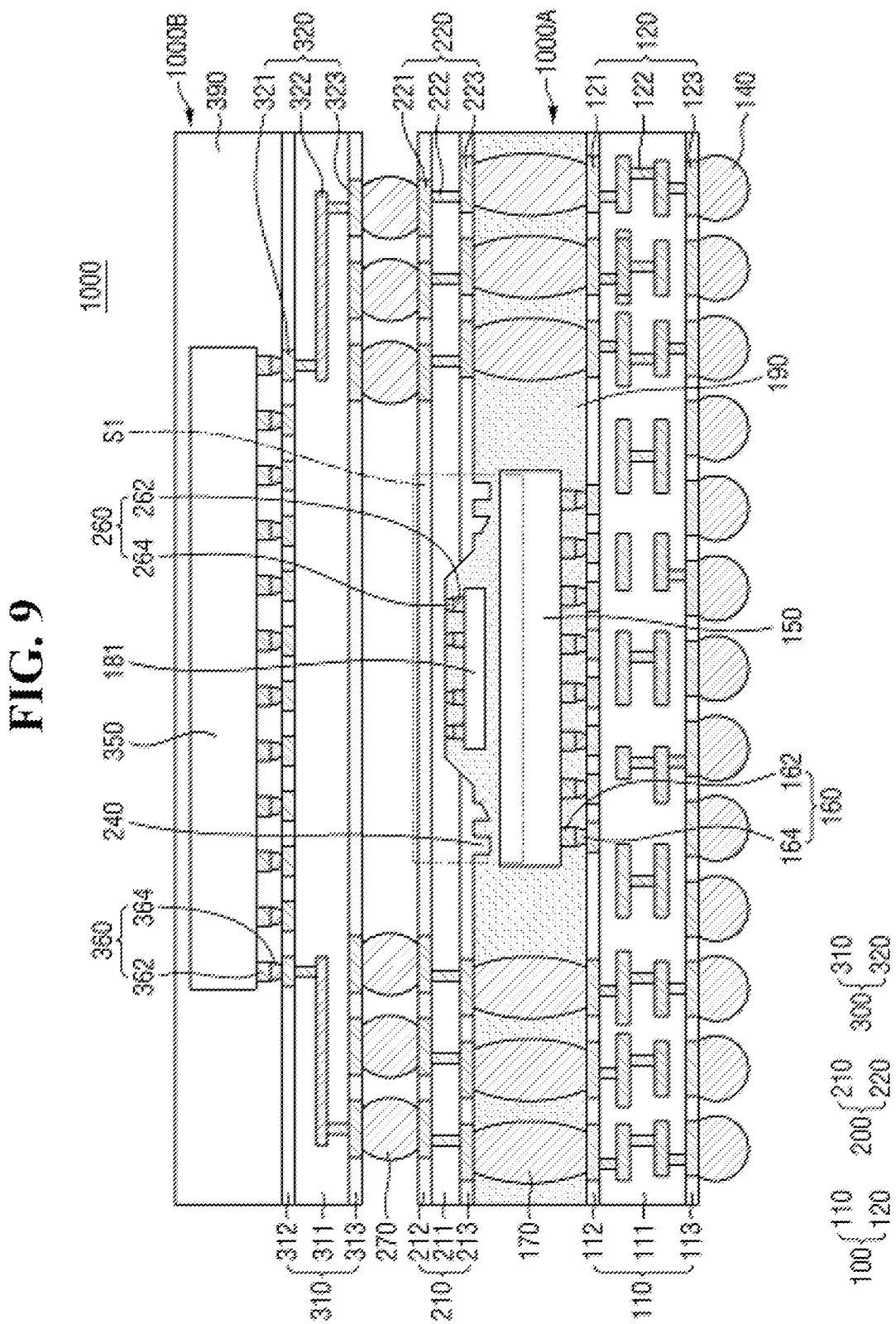
FIG. 9 is a schematic cross-sectional view of a semiconductor package according to some embodiments, taken along line I-I' of FIG. 4.
Figure 10:
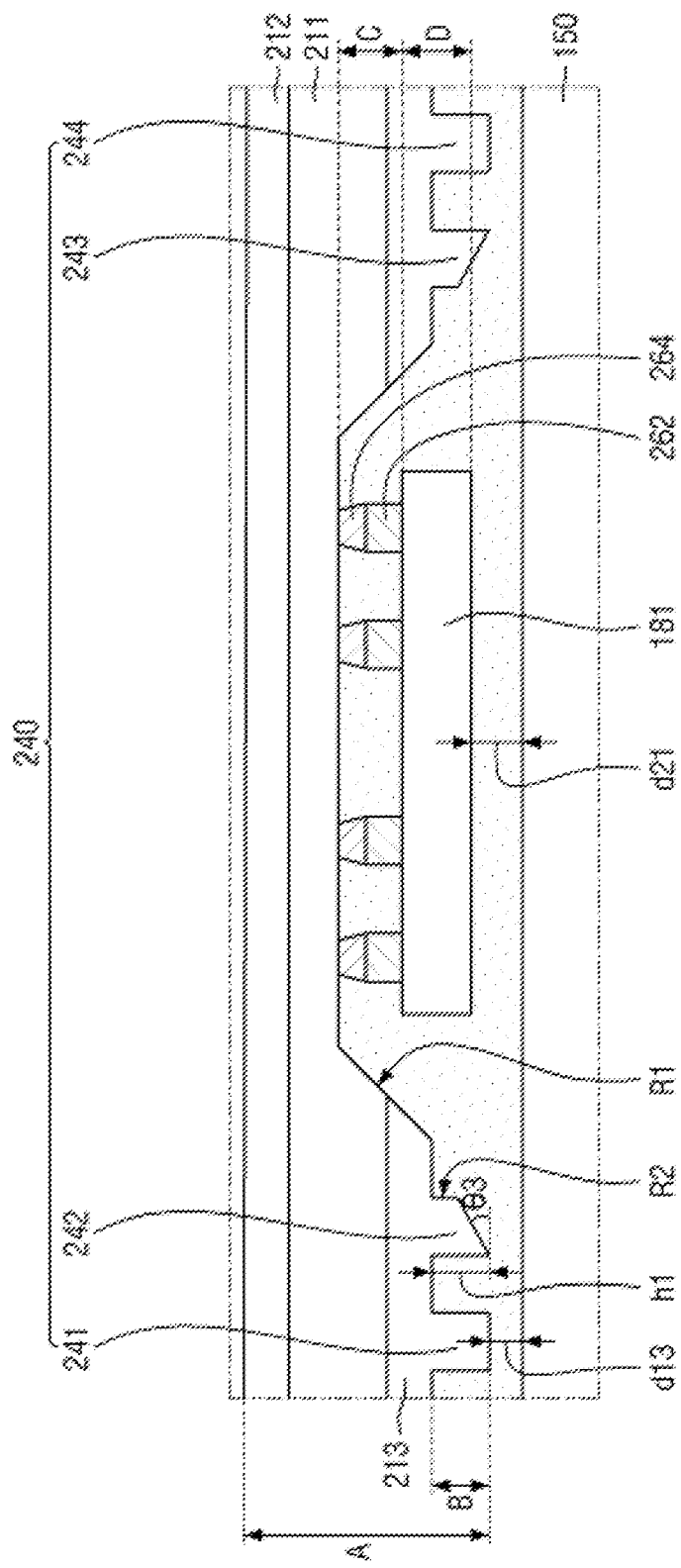
FIG. 10 is an enlarged view of a region 51 of FIG. 9.

FIG. 7 is a schematic cross-sectional view of a semiconductor package according to some embodiments, taken along line I-I' of FIG. 4. FIG. 8 is an enlarged view of a region Si of FIG. 7. FIG. 9 is a schematic cross-sectional view of a semiconductor package according to some embodiments, taken along line I-I' of FIG. 4. FIG. 10 is an enlarged view of a region Si of FIG. 9.

Referring to FIGS. 7 to 10, in an embodiment, the thickness B of the protrusion 240 decreases as the protrusion 240 becomes closer to the first recess R1.

The first to fourth protrusion patterns 241, 242, 243 and 244 each have one surface that protrudes from the first surface 200_2 of the interposer 200 and contacts the first mold layer 190. The thicknesses of the innermost protrusion patterns 242 and 243 that are closest to the first recess R1 are less than those of the other protrusion patterns 241 and 244 that are farther from the first recess R1.

Referring to FIG. 8, in an embodiment, a thickness h1 of the second protrusion pattern 242 is less than the thickness B of the first protrusion pattern 241. Similarly, the thickness of the third protrusion pattern 243 is less than that of the fourth protrusion pattern 244. That is, the thicknesses of the first to fourth protrusion patterns 241, 242, 243 and 244 decrease as the protrusion patterns become closer to the first recess R1.

Referring to FIG. 10, in an embodiment, a slope of a surface of the innermost protrusion patterns 242 and 243 closest to the first recess R1, forms an angle θ3 with a surface parallel with the first surface 200_2 of the interposer 200 that is not 180°. For example, the slope one of a surface of the second protrusion pattern 242 and a surface parallel with the first surface 200_2 of the interposer 200 form an acute angle θ3. In this case, the thickness h1 of the second protrusion pattern 242 decreases with decreasing distance to the first recess R1, but embodiments not limited thereto.

Hereinafter, a semiconductor package according to some embodiments of the present disclosure will be described with reference to FIG. 11. For convenience of description, the following will be based on differences from a semiconductor package shown in FIGS. 1 to 6.

Figure 11:
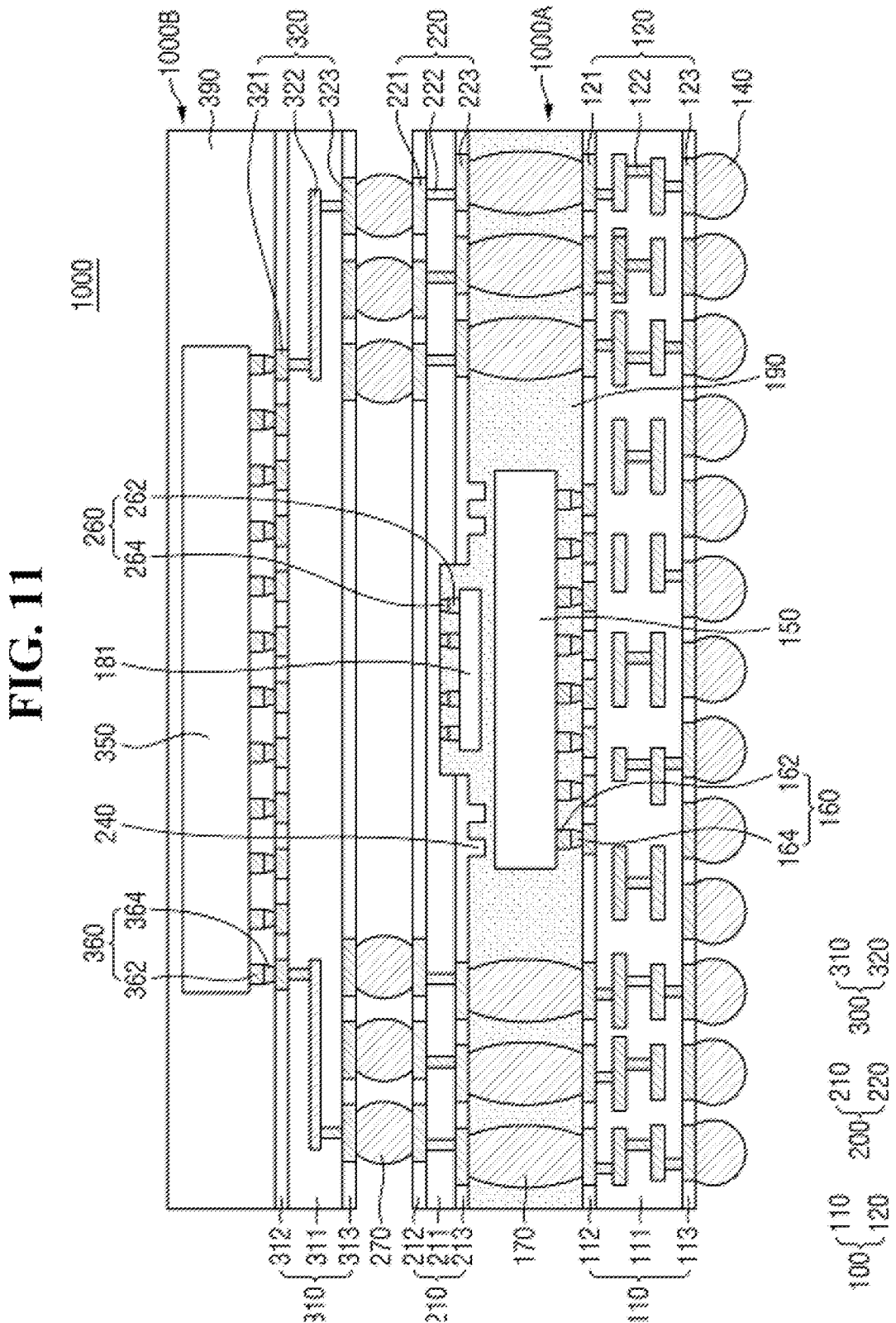
FIG. 11 is a schematic cross-sectional view of a semiconductor package according to some embodiments, taken along line I-I' of FIG. 4.

FIG. 11 is a schematic cross-sectional view of a semiconductor package according to some embodiments, taken along line I-I' of FIG. 4.

Referring to FIG. 11, in an embodiment, the first sidewall of the first recess R1 and the second sidewall of the second recess R2 are perpendicular to a surface parallel with the first surface 200_2. For example, an angle formed the first sidewall of the first recess R1 or the second sidewall of the second recess R2 and the surface parallel with the first surface 200_2 is 90°. In this case, the slope of the first sidewall of the first recess R1 and the slope of the second sidewall of the second recess R2 are equal to each other.

Hereinafter, a semiconductor package according to some embodiments of the present disclosure will be described with reference to FIG. 12. For convenience of description, the following will be based on differences from a semiconductor package shown in FIGS. 1 to 6.

Figure 12:
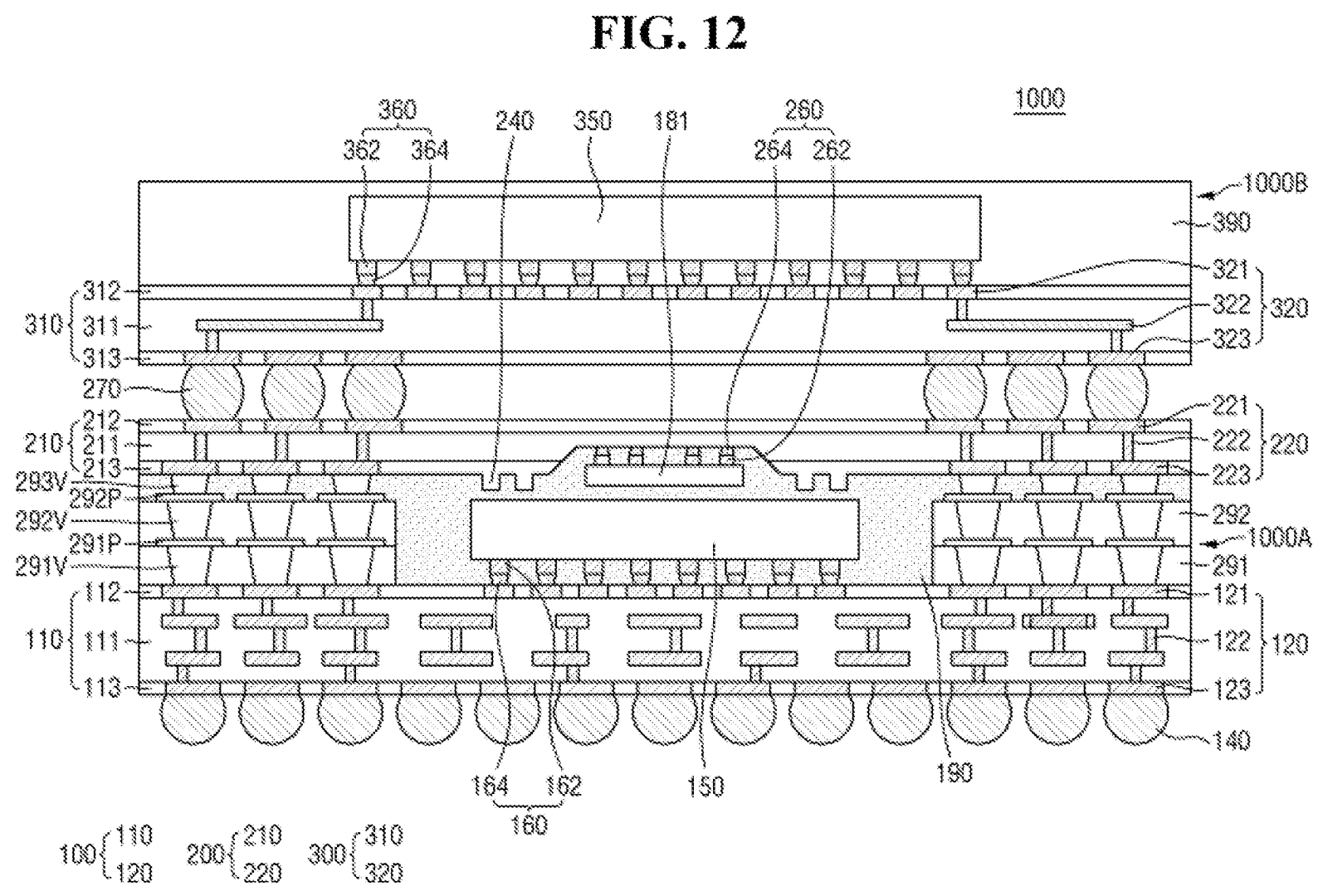

FIG. 12 is a schematic cross-sectional view of a semiconductor package according to some embodiments, taken along line I-I' of FIG. 4.

Referring to FIG. 12, a semiconductor package according to some embodiments of the present disclosure includes a third mold layer 291, a fourth mold layer 292, first to third connection vias 291V, 292V and 293V, a first connection pad 291P, and a second connection pad 292P, which are disposed between the first wiring structure 100 and the interposer 200.

The third mold layer 291 is disposed on the upper surface of the first wiring structure 100. The third mold layer 291 surrounds a sidewall of the first semiconductor chip 150. The third mold layer 291 is spaced apart from the sidewall of the first semiconductor chip 150. For example, the third mold layer 291 is not in contact with the first semiconductor chip 150.

The fourth mold layer 292 is disposed on the third mold layer 291. The fourth mold layer 292 surrounds the sidewall of the first semiconductor chip 150. The fourth mold layer 292 is spaced apart from the sidewall of the first semiconductor chip 150. For example, the fourth mold layer 292 is not in contact with the first semiconductor chip 150.

Each of the third mold layer 291 and the fourth mold layer 292 includes an insulating material. Each of the third mold layer 291 and the fourth mold layer 292 includes a material that differs from that of the first mold layer 190, but embodiments of the present disclosure are not limited thereto.

The first connection pad 291P is disposed on an upper surface of the third mold layer 291. The second connection pad 292P is disposed on an upper surface of the fourth mold layer 292. Each of the first connection pad 291P and the second connection pad 292P includes a conductive material.

The first connection via 291V penetrates through the third mold layer 291. The first connection via 291V is connected to each of the first upper pad 121 and the first connection pad 291P. The second via 292V penetrates through the fourth mold layer 292. The second via 292V is connected to each of the first connection pad 291P and the second connection pad 292P. The third via 293V penetrates through the first mold layer 190. The third via 293V is connected to each of the second connection pad 292P and the second lower pad 223.

The interposer 200 is electrically connected to the first wiring structure 100 through the first to third connection vias 291V, 292V and 293V and the first and second connection pads 291P and 292P.

Hereinafter, a semiconductor package according to some embodiments of the present disclosure will be described with reference to FIG. 13. For convenience of description, the following will be based on differences from the semiconductor package shown in FIGS. 1 to 6.

Figure 13:
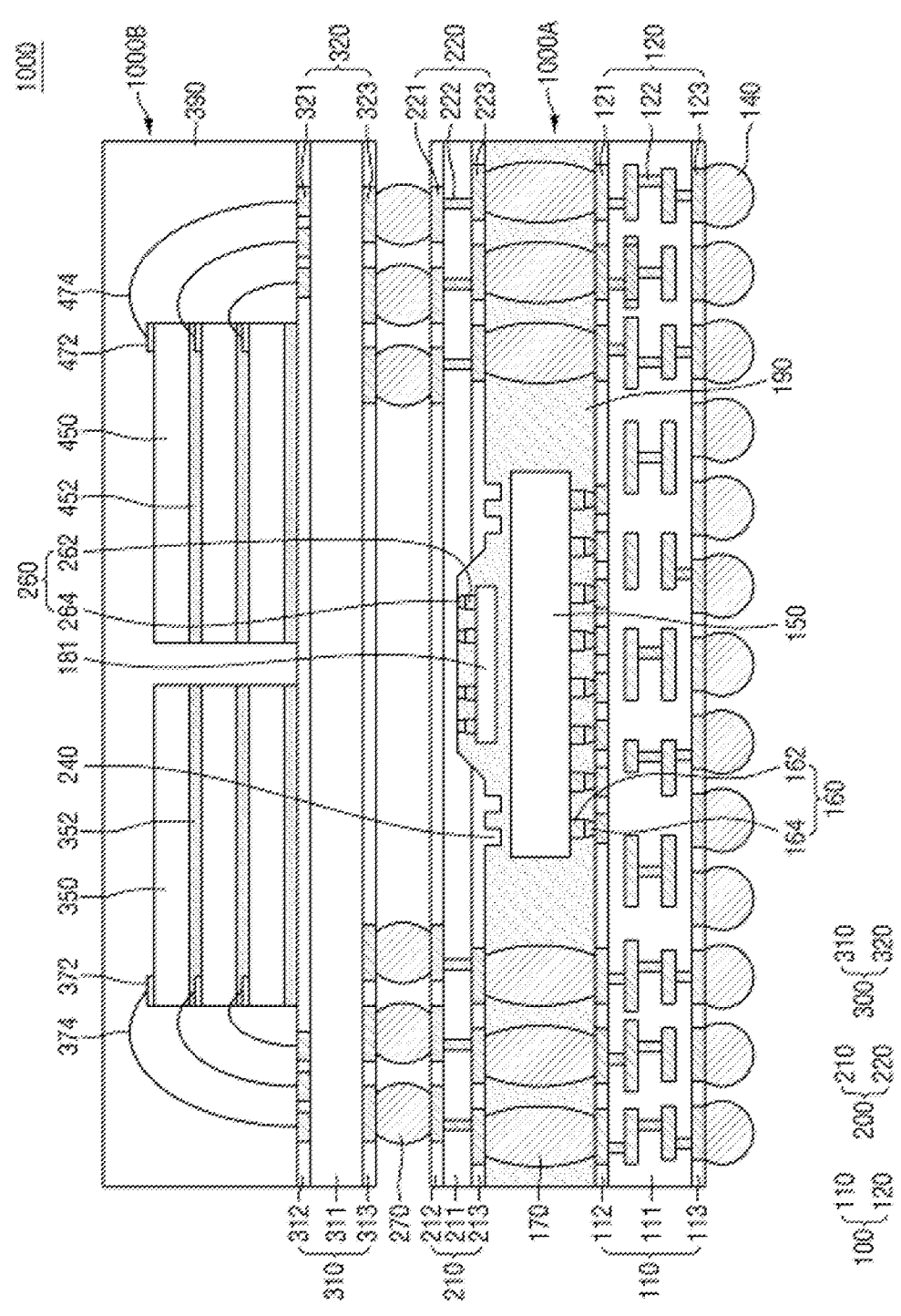
FIG. 13 is a schematic cross-sectional view of a semiconductor package according to some embodiments, taken along line I-I' of FIG. 4.

FIG. 13 is a schematic cross-sectional view of a semiconductor package according to some embodiments, taken along line I-I' of FIG. 4.

Referring to FIG. 13, in an embodiment, a semiconductor package according to some embodiments includes second semiconductor chips 350 and third semiconductor chips 450. The second semiconductor chips 350 and the third semiconductor chips 450 are deposited structures. The number of deposited structures and the number of semiconductor chips constituting the deposited structures may vary.

For example, the first semiconductor chip 150 may be a logic chip, and the second semiconductor chips 350 and the third semiconductor chips 450 may be memory chips.

The second semiconductor chips 350 are packaged on the third wiring structure 300 by a third adhesive layer 352. The third semiconductor chips 450 are packaged on the third wiring structure 300 by a fourth adhesive layer 452. The third adhesive layer 352 and the fourth adhesive layer 452 include, for example, at least one of a liquid epoxy, an adhesive tape, a conductive medium, or combinations thereof, but embodiments are not limited thereto.

The second semiconductor chips 350 are electrically connected with the third wiring structure 300 by a first bonding wire 374. For example, the first bonding wire 374 connects a first chip pad 372 to the third upper pad 321 of the third wiring structure 300. The third semiconductor chips 450 are electrically connected with the third wiring structure 300 by a second bonding wire 474. For example, the second bonding wire 474 connects a second chip pad 472 to the third upper pad 321 of the third wiring structure 300, but embodiments of the present disclosure are not limited thereto. In other embodiments, the second semiconductor chips 350 and/or the third semiconductor chips 450 are electrically connected with the third upper pad 321 by, for example, a bonding tape, etc.

Hereinafter, a semiconductor package according to some other embodiments of the present disclosure will be described with reference to FIGS. 14 to 17. For convenience of description, the following will be based on differences from a semiconductor package shown in FIGS. 1 to 6.

Figure 14:
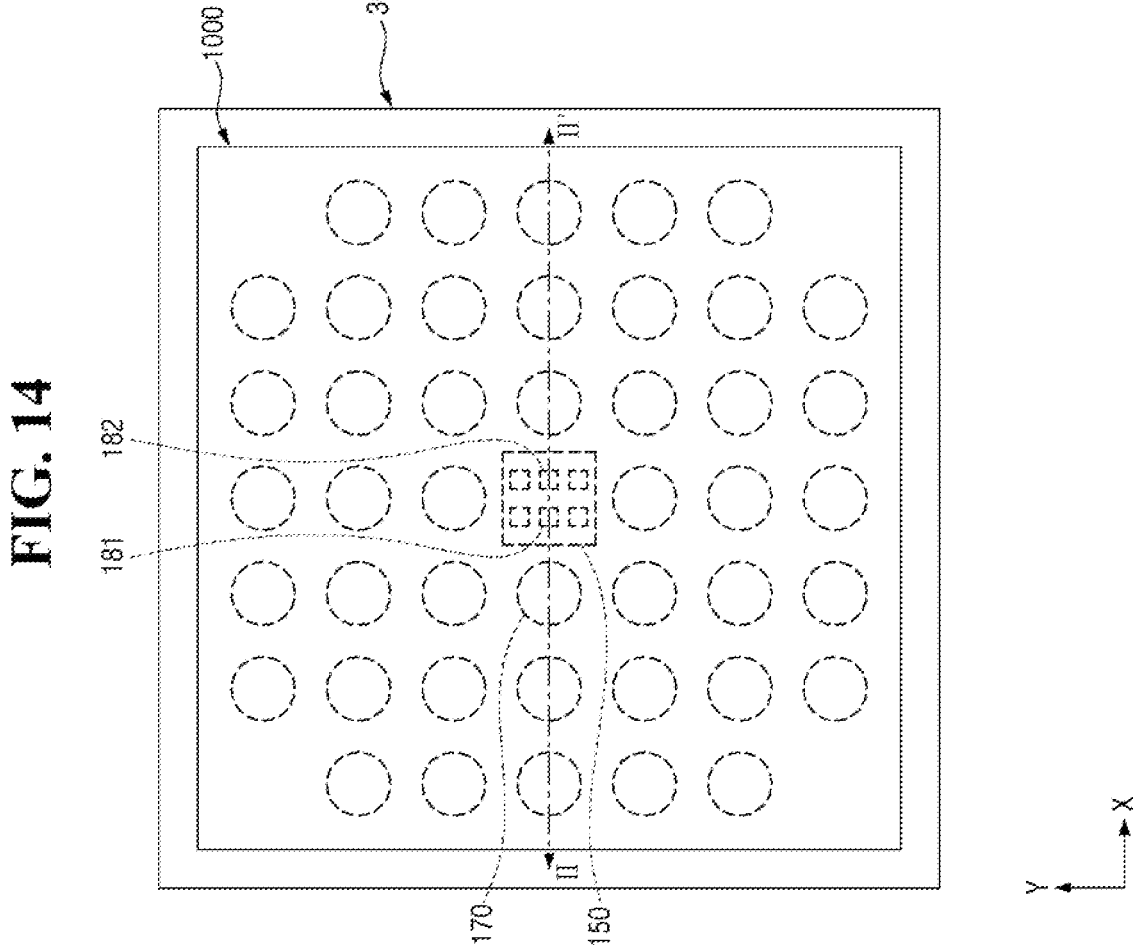
FIG. 14 is a layout view of a semiconductor package according to some embodiments of FIG. 3.
Figure 15:
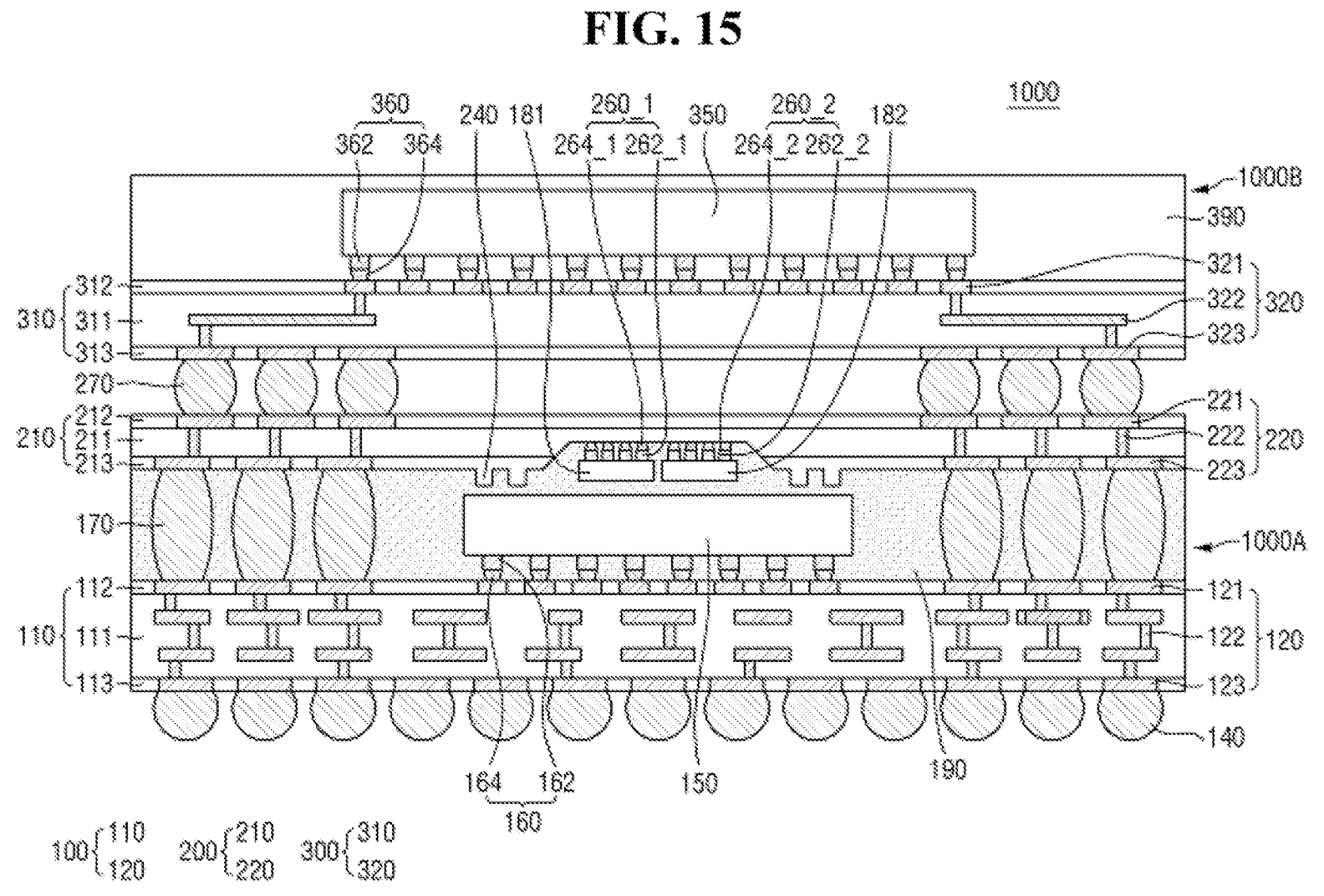
Figure 16:
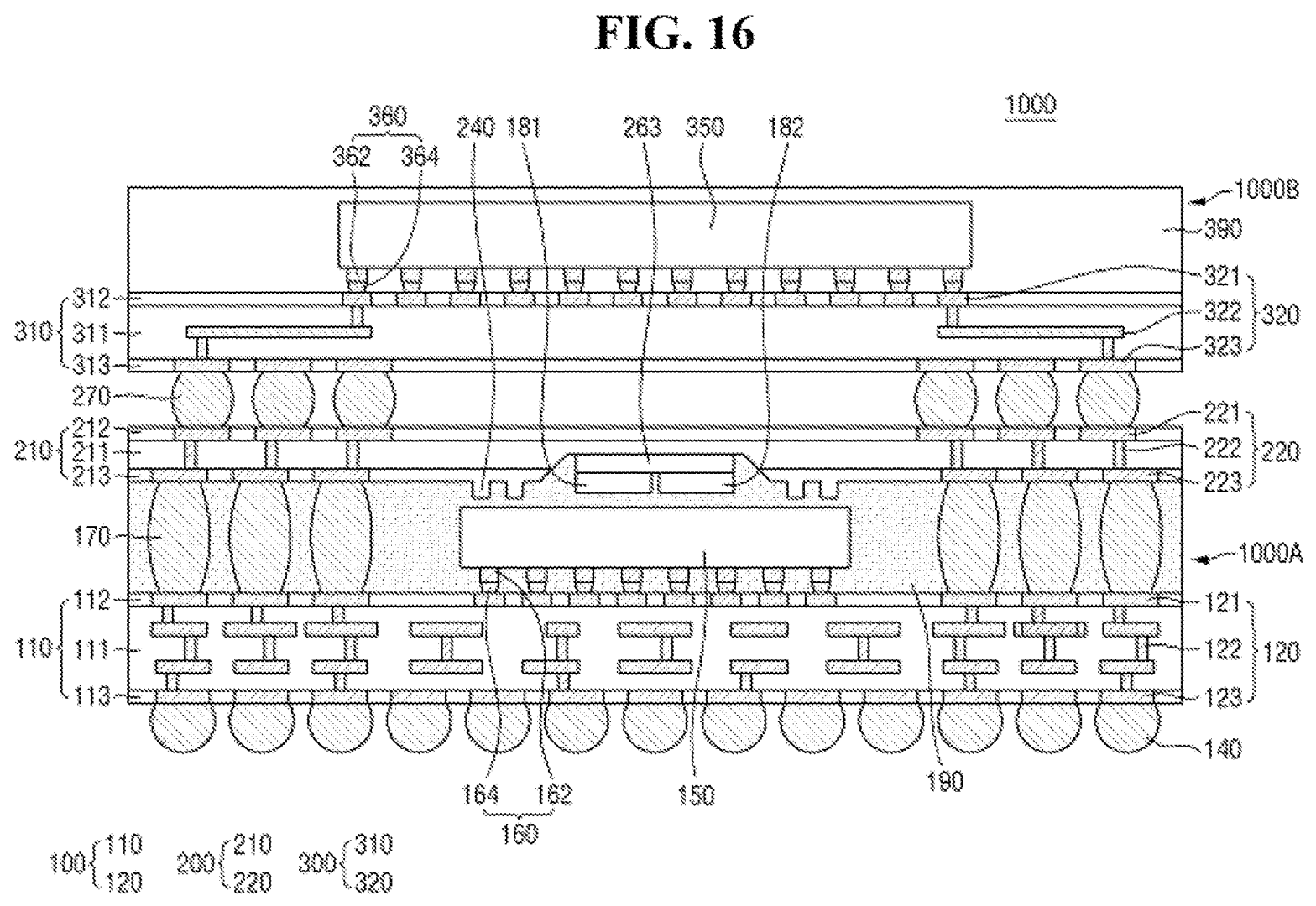
Figure 17:
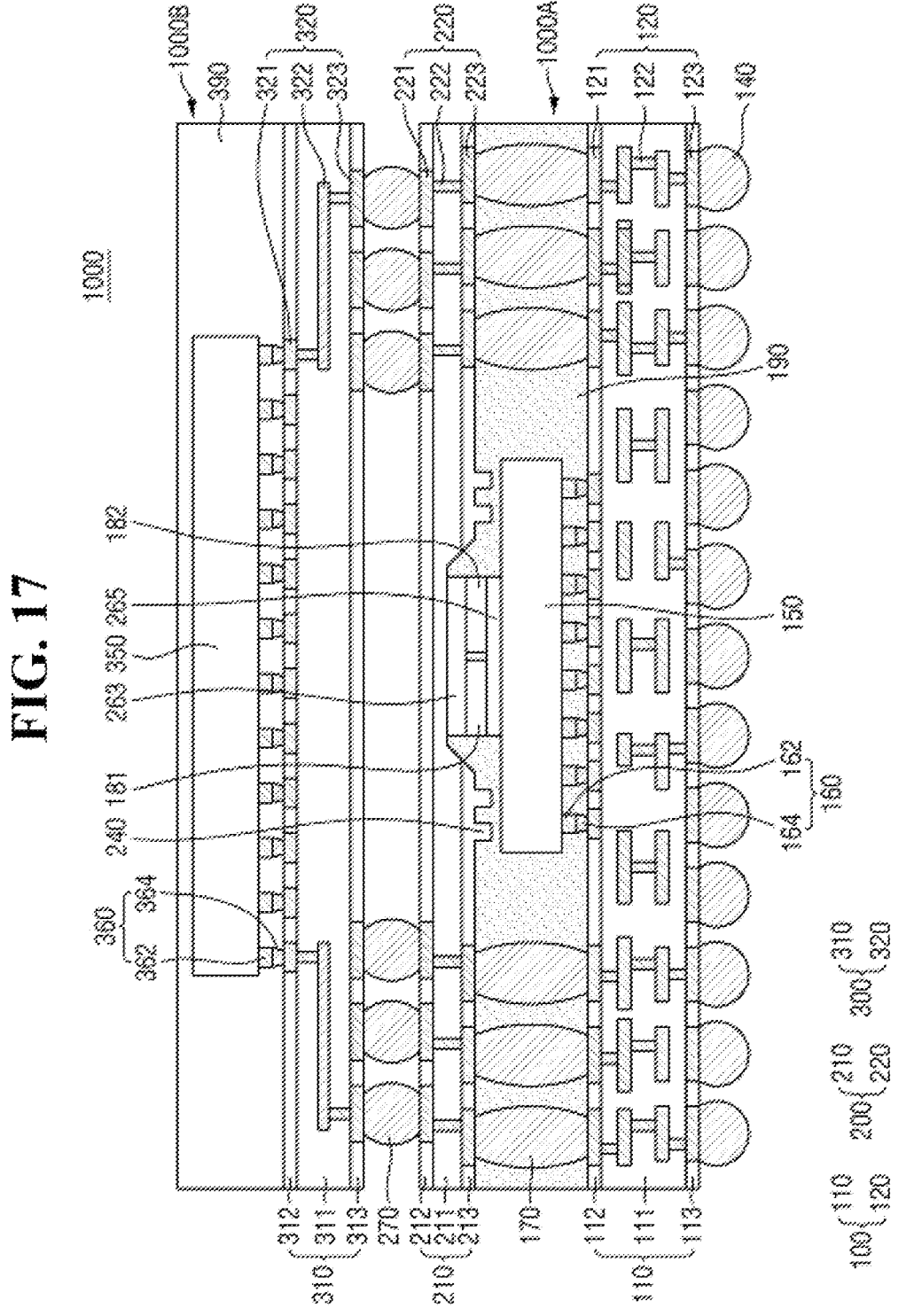
FIG. 17 is a schematic cross-sectional view of a semiconductor package according to some embodiments, taken along line II-IF of FIG. 14.

FIG. 14 is a layout view of a semiconductor package according to some embodiments of FIG. 3. FIG. 15 is a schematic cross-sectional view of a semiconductor package according to some embodiments, taken along line II-IF of FIG. 14. FIG. 16 is a schematic cross-sectional view of a semiconductor package according to some embodiments, taken along line II-II' of FIG. 14. FIG. 17 is a schematic cross-sectional view of a semiconductor package according to some embodiments, taken along line II-IF of FIG. 14.

Referring to FIG. 15, in an embodiment, the semiconductor package 1000 includes a first element 181 and a second element 182 that are spaced apart from each other in a direction parallel with the first surface 200_2 of the interposer 200. In addition, the first element 181 and the second element 182 are passive elements. A semiconductor package according to some embodiments may include a plurality of passive elements.

The first element 181 is packaged on the interposer 200 by a flip chip bonding method. For example, a (2_1)th bump 260_1 is formed between the first surface 200_2 of the interposer 200 and a lower surface of the first element 181. The (2_1)th bump 260_1 electrically connects the interposer 200 with the first element 181.

The first mold layer 190 integrally covers a side of the (2_1)th bump 260_1.

The (2_1)th bump 260_1 includes, for example, a (2_1)th pillar layer 262_1 and a (2_1)th solder layer 264_1.

The (2_1)th pillar layer 262_1 protrudes from the upper surface of the first element 181. The (2_1)th solder layer 264_1 connects the (2_1)th pillar layer 262_1 with the interposer 200. For example, the (2_1)th solder layer 264_1 is connected to a portion of the second lower pads 223.

The description of the second pillar layer 262 and the second solder layer 264 of the second bump 260 applies to the description of the (2_1)th pillar layer 262_1 and the (2_1)th solder layer 264_1.

The second element 182 is packaged on the interposer 200 by a flip chip bonding method. For example, a (2_2)th bump 260_2 is formed between the first surface 200_2 of the interposer 200 and a lower surface of the second element 182. The (2_2)th bump 260_2 electrically connects the interposer 200 with the second element 182.

The first mold layer 190 covers a side of the (2_2)th bump 260_2.

The (2_2)th bump 260_2 include, for example, a (2_2)th pillar layer 262_2 and a (2_2)th solder layer 264_2.

The (2_2)th pillar layer 262_2 protrudes from the upper surface of the second element 182. The (2_2)th solder layer 264_2 connects the (2_2)th pillar layer 262_2 with the interposer 200. For example, the (2_2)th solder layer 264_2 is connected to a portion of the second lower pads 223.

The description of the second pillar layer 262 and the second solder layer 264 of the second bump 260 applies to the description of the (2_2)th pillar layer 262_2 and the (2_2)th solder layer 264_2.

The (2_1)th pillar layer 262_1 and the (2_2)th pillar layer 262_2 are formed by a same process. The (2_1)th solder layer 264_1 and the (2_2)th solder layer 264_2 are formed by a same process, but embodiments are are not limited thereto.

According to some embodiments, a plurality of passive elements may be disposed on the first semiconductor chip 150, to provide a more diversified path through which heat generated on the first semiconductor chip 150 is emitted. As a result, heat generated from the first semiconductor chip 150 is effectively emitted out from the semiconductor package.

Referring to FIG. 16, in an embodiment, the semiconductor package 1000 includes a first adhesive layer 263 interposed between the first element 181 and the interposer 200. The first mold layer 190 integrally covers a side of the first adhesive layer 263.

Referring to FIG. 17, in an embodiment, the semiconductor package 1000 includes a second adhesive layer 265 interposed between the first element 181 and the first semiconductor chip 150. The first mold layer 190 integrally covers the sides of the first and second adhesive layers 263 and 265.

A material of the first adhesive layer 263 and the second adhesive layer 265 is not limited, as long as these adhesive layers can attach the first and second elements 181 and 182 onto the first semiconductor chip 150. For example, the first adhesive layer 263 and the second adhesive layer 265 are die attach films (DAF). In addition, for example, the first adhesive layer 263 and the second adhesive layer 265 may include a non-conductive material or resin. As a result, heat generated from the first semiconductor chip 150 is more effectively emitted out from the semiconductor package.

FIGS. 18 to 23 illustrate intermediate steps of a method of fabricating a semiconductor package according to some embodiments.

Figure 18:
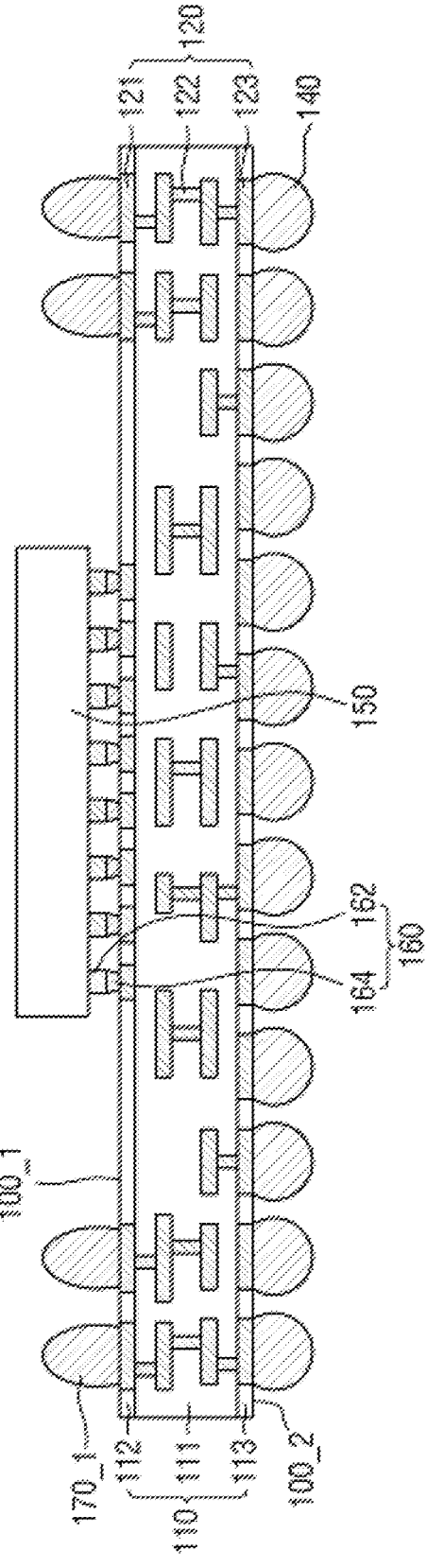
FIGS. 18 to 23 illustrate intermediate steps of a method of fabricating a semiconductor package according to some embodiments.
Figure 19:
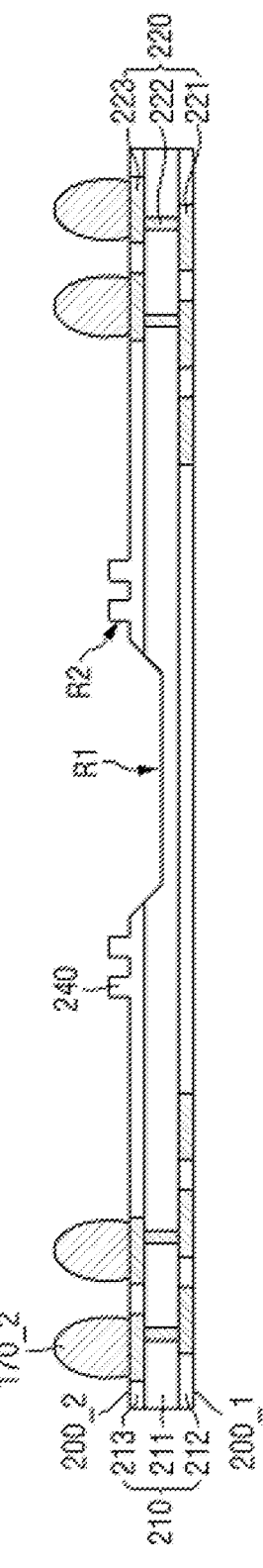
Figure 20:
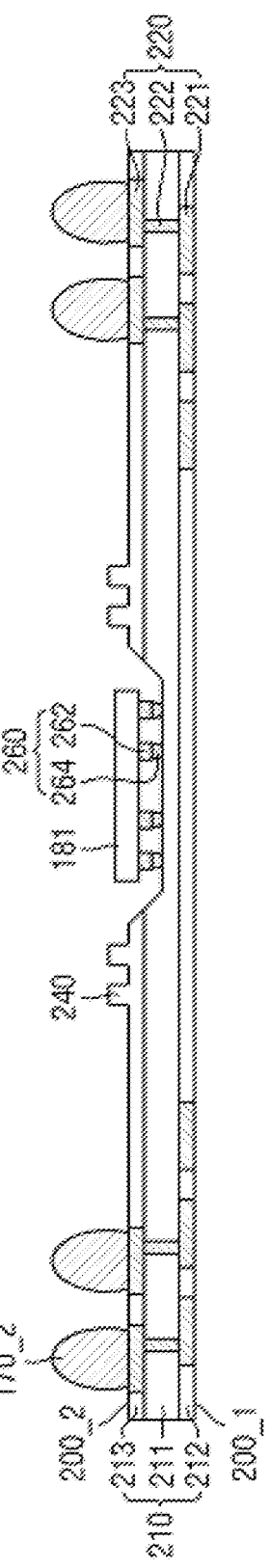

Referring to FIGS. 18 to 20, in an embodiment, the first element 181 is formed on the first semiconductor chip 150 when the first semiconductor chip 150 is packaged onto the first wiring structure 100.

In detail, referring to FIG. 18, the first semiconductor chip 150 and a first pre-connection member 170_1 are disposed on a first surface 100_1 of the first wiring structure 100.

The first semiconductor chip 150 is in contact with the first upper pad 121 of the first wiring structure 100 through the first bump 160.

Referring to FIG. 19, in an embodiment, a second wiring structure 200 that includes a second insulating layer 210 and a second conductive pattern 220 and a first recess R1 is formed on a first surface 200_2 of the second wiring structure. A method of forming the first recess R1 is not especially limited. For example, the first recess R1 is formed by performing a photoresist process. A second pre-connection member 170_2 is disposed on the first surface 200_2 of the second wiring structure 200.

A protrusion 240 is formed that protrudes from the first surface 200_2 of the second wiring structure 200. A method of forming the protrusion 240 is not especially limited. For example, the protrusion 240 is formed by a photoresist process.

The second recess R2 is formed along a surface of the protrusion 240. The second recess R2 has a sidewall that protrudes from the first surface 200_2, and a bottom surface connected with the sidewall.

Referring to FIG. 20, in an embodiment, a passive first element 181 is formed inside the first recess R1. The first element 181 is connected with the second wiring structure 200 through the second bump 260.

The first element 181, to which the first adhesive layer 263 and/or the second adhesive layer 265 is attached, is formed by being packaged onto the first surface 200_2 of the interposer 200, but embodiments are not limited thereto.

Figure 21:
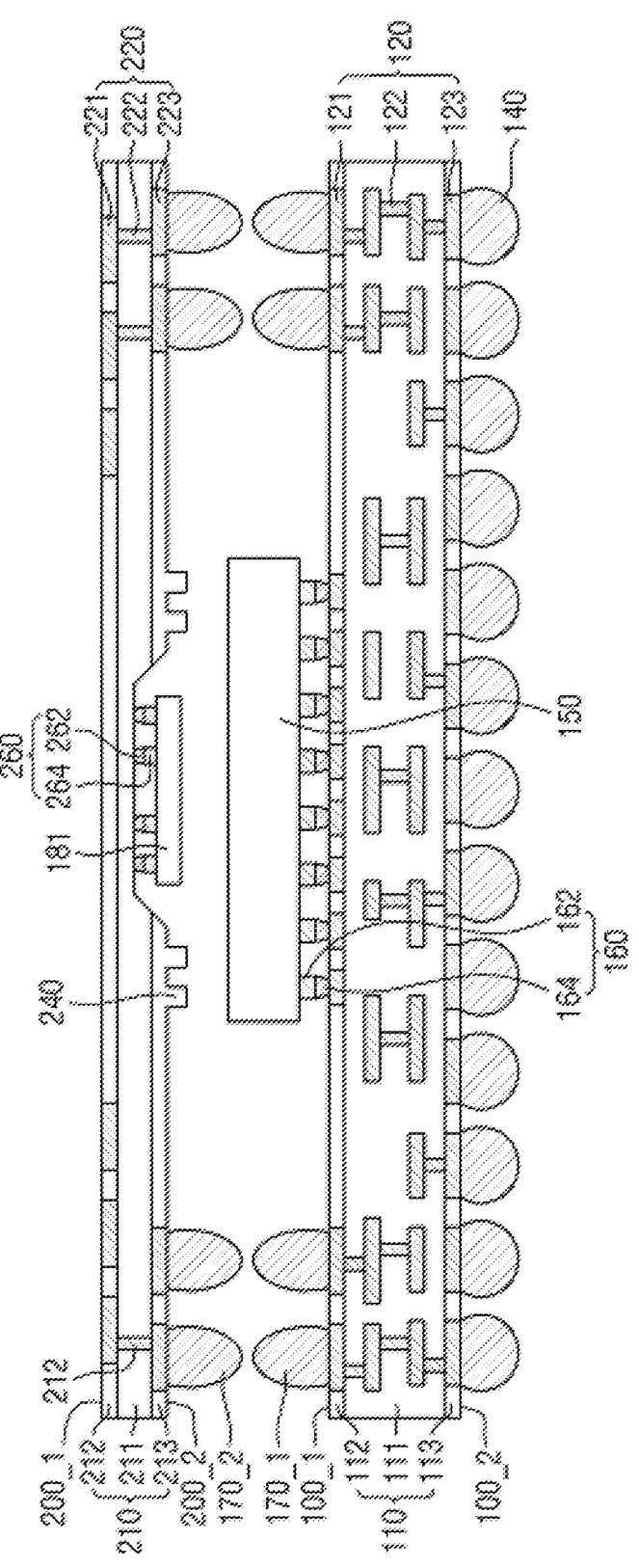

Referring to FIG. 21, in an embodiment, the second wiring structure 200 and the first element 181 are deposited on the first wiring structure 100 on which the first semiconductor chip 150 is formed. The second wiring structure 200 is deposited on the first wiring structure 100 so that the first surface 200_2 of the second wiring structure 200 faces the first surface 100_1 of the first wiring structure 100.

For example, the second wiring structure 200 is deposited on the first wiring structure 100 by a thermal compression (TC) bonding method that applies heat while pressing the upper surface of the second wiring structure 200 by using a bonding tool.

Figure 22:
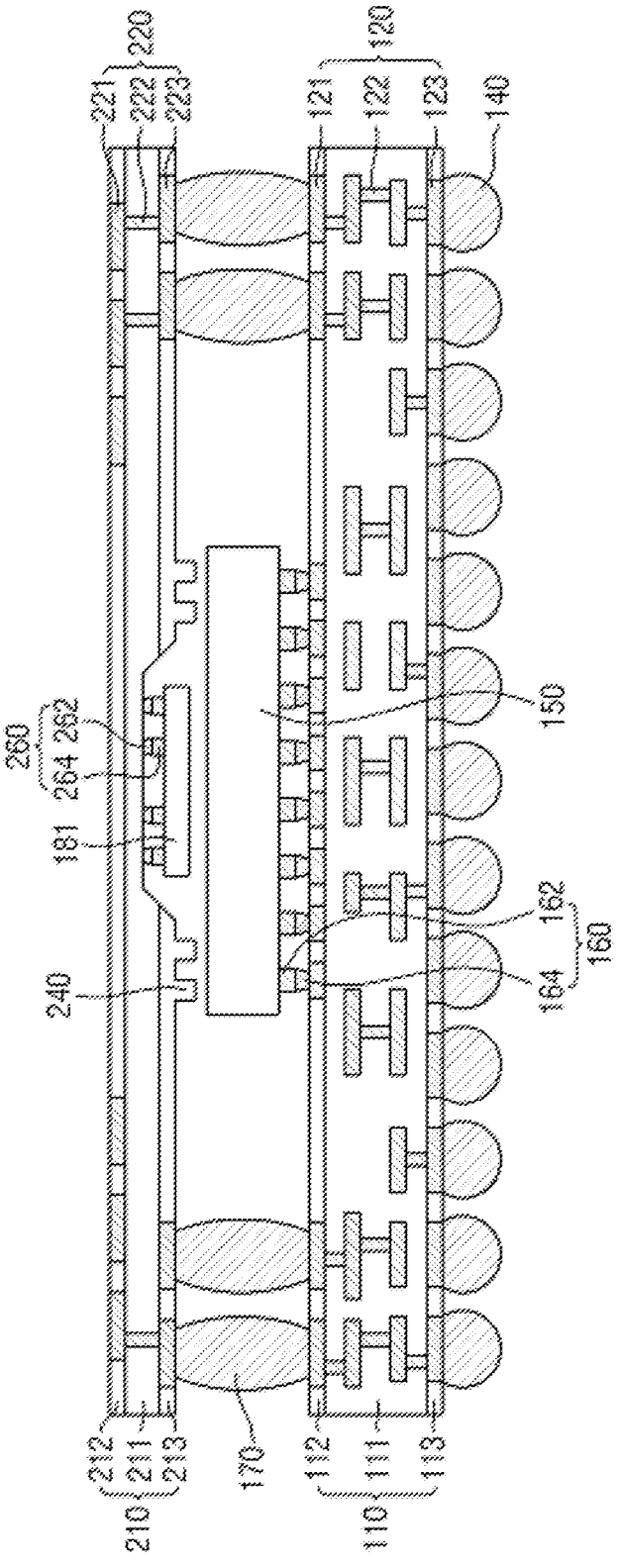

Referring to FIG. 22, in an embodiment, the first pre-connection member 170_1 of the first wiring structure 100 and the second pre-connection member 170_2 of the second wiring structure 200 are connected to each other to form the first connection member 170. A method of forming the first connection member 170 is not especially limited. For example, the first connection member 170 is formed by applying heat to melt a solder.

Figure 23:
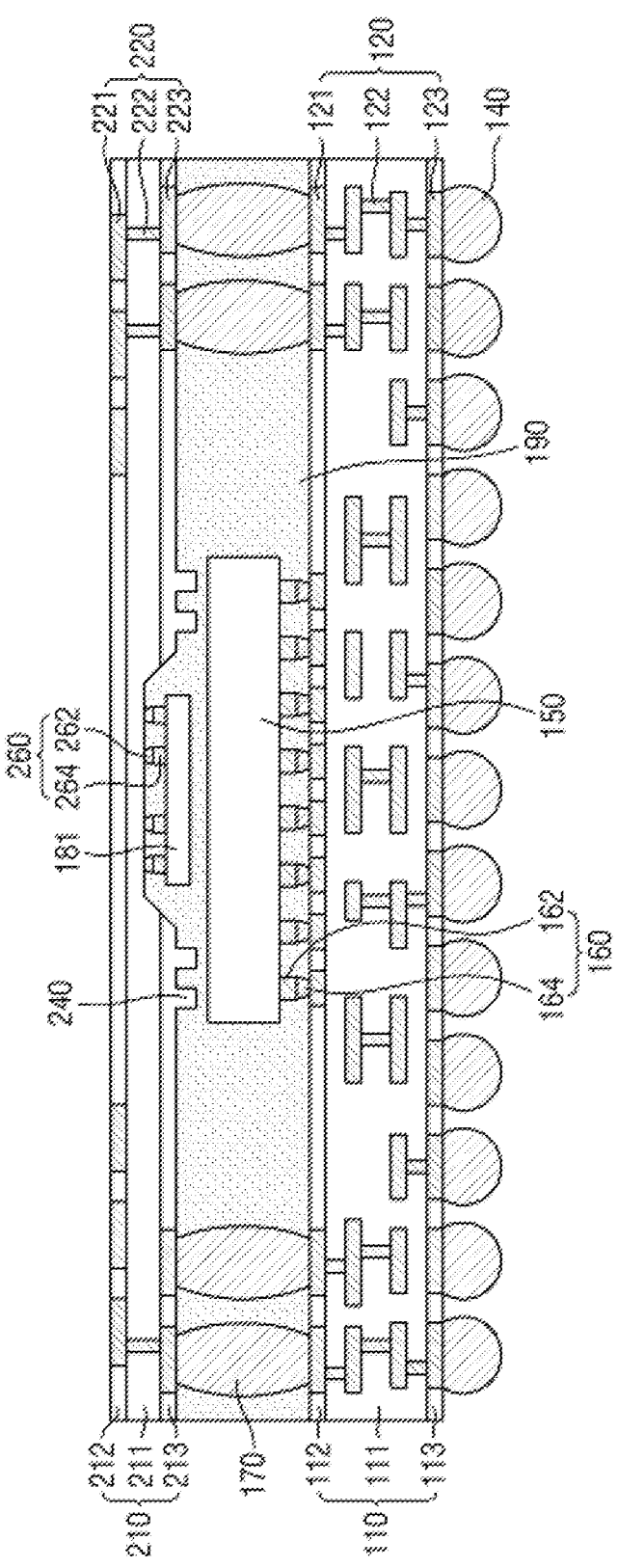

Referring to FIG. 23, in an embodiment, a first mold layer 190 is formed that covers sides of the first connection member 170 and the first semiconductor chip 150 and is in contact with the first element 181. The first mold layer 190 is formed on the first surface 100_1 of the first wiring structure 100 and the second surface 200_2 of the second wiring structure 200. The first element 181 is disposed inside the first mold layer 190 of the semiconductor package and supports the inside of the semiconductor package.

The first mold layer 190 integrally fills between the sidewall and the bottom surface of the first recess R1 and between the sidewall and the bottom surface of the second recess R2. As a result, since a separate underfill material surrounding each of the first bump 160 and the second bump 260 is not interposed, a fabricating process of the semiconductor package is simplified.

The first mold layer 190 may include, but is not limited to, an insulating polymer material such as an epoxy molding compound (EMC).

Subsequently, referring to FIG. 5, in an embodiment, the second connection member 270 is formed on the second upper pad 221. The second connection member 270 electrically connects the second wiring structure 200 with the third wiring structure 300. The semiconductor package 1000 includes a second semiconductor chip 1000B that differs from the first semiconductor chip 1000A, and the first semiconductor chip 1000A and the second semiconductor chip 1000B are electrically connected with each other through the second connection member 270.

Although embodiments of the present disclosure have been described with reference to the accompanying drawings, it will be apparent to those skilled in the art that embodiments of the present disclosure can take various other forms without being limited to described embodiments and can be embodied in other specific forms without departing from the spirit and essential characteristics of the inventive concept. Thus, described embodiments are to be considered in all respects as illustrative and not restrictive.

What is claimed is:

1. A semiconductor package, comprising:
a wiring structure that includes a first insulating layer and a first conductive pattern inside the first insulating layer;
a first semiconductor chip disposed on the wiring structure;
an interposer disposed on the first semiconductor chip, wherein the interposer includes a second insulating layer, a second conductive pattern inside the second insulating layer, and a recess that includes a first sidewall formed on a first surface of the interposer that faces the first semiconductor chip and a first bottom surface connected with the first sidewall, wherein the recess exposes at least a portion of the second insulating layer;
a first element bonded to the interposer and that faces the first semiconductor chip inside the recess; and
a mold layer that covers the first semiconductor chip and the first element,
wherein the interposer further includes a protrusion on the first surface that protrudes toward the first semiconductor chip.

2. The semiconductor package of claim 1, wherein the mold layer is filled in the recess and integrally covers a side and a lower surface of the first semiconductor chip and a side of the first element.

3. The semiconductor package of claim 1, wherein the first surface includes a connection surface that connects the recess with the protrusion.

4. The semiconductor package of claim 3, wherein a shortest distance between an edge of the first element and an edge that connects the first sidewall of the recess with the first bottom surface is a first distance,
a shortest distance between a side of the first element and the connection surface is a second distance,
a shortest distance from the protrusion to an upper surface of the first semiconductor chip is a third distance, and
the third distance is equal to or less than the first distance and equal to or less than the second distance.

5. The semiconductor package of claim 4, wherein the second distance is greater than the first distance.

6. The semiconductor package of claim 4, wherein the third distance is less than or equal to a distance from the first element to the upper surface of the first semiconductor chip.

7. The semiconductor package of claim 1, wherein a thickness of the protrusion is less than that of the first element.

8. The semiconductor package of claim 1, wherein a thickness of the protrusion decreases as the protrusion becomes closer to the recess.

9. The semiconductor package of claim 1, wherein the protrusion includes a plurality of protrusions, and the mold layer fills a space between the plurality of protrusions.

10. The semiconductor package of claim 1, wherein the interposer further includes a second surface that faces the first surface, and a width of the recess decreases as the recess becomes closer to the second surface.

11. The semiconductor package of claim 1, wherein the interposer includes a substrate and a passivation layer disposed on both sides of the substrate, and the recess includes a first portion that penetrates through the passivation layer and a second portion in the substrate.

12. The semiconductor package of claim 1, wherein the mold layer includes a filler, and a distance from a bottom surface of the recess to the first element is $\frac{1}{2}$ times or more than an average diameter of the filler.

13. A semiconductor package, comprising:
a wiring structure that includes a first insulating layer and a first conductive pattern inside the first insulating layer;
a first semiconductor chip disposed on the wiring structure;
an interposer disposed on the first semiconductor chip, wherein the interposer includes a second insulating layer, a second conductive pattern inside the second insulating layer, and a multi-stage recess formed on a first surface of the interposer, wherein the multi-stage recess includes a first stage recess that has a first width, and a second stage recess that is connected to the first stage recess and that has a second width greater than the first width;
a first element bonded to the interposer inside the multi-stage recess and that faces the first semiconductor chip; and
a first bump connected to the first element positioned in the first stage recess,
wherein a shortest distance from an upper surface of the second stage recess to an upper surface of the first semiconductor chip is less than or equal to a distance from the first element to the upper surface of the first semiconductor chip, and
wherein the interposer further includes a protrusion that protrudes from the first surface toward the first semiconductor chip.

14. The semiconductor package of claim 13, wherein a slope of a second sidewall of the second stage recess is greater than that of a first sidewall of the first stage recess.

15. The semiconductor package of claim 13, wherein the first surface includes a connection surface that connects the first stage recess with the second stage recess,
a shortest distance between an edge of the first element and an edge that connects a first sidewall of the first stage recess with a first bottom surface of the first stage recess is a first distance,
a shortest distance between a side of the first element and the connection surface is a second distance,
the shortest distance from the second stage recess to the upper surface of the first semiconductor chip is a third distance, and
the third distance is equal to or less than the first distance and is equal to or less than the second distance.

16. The semiconductor package of claim 13, wherein the interposer further includes a second surface that faces the first surface, and
a width of the first stage recess decreases as the first stage recess becomes closer to the second surface.

17. The semiconductor package of claim 13, further comprising a mold layer that fills in the first stage recess and covers the first semiconductor chip and the first element.

18. The semiconductor package of claim 13, wherein an upper surface of the first element is positioned in the second stage recess.

19. A semiconductor package, comprising:

a wiring structure that includes a first insulating layer and a first conductive pattern inside the first insulating layer;

a first semiconductor chip disposed on the wiring structure;

an interposer disposed on the first semiconductor chip, wherein the interposer includes a second insulating layer, a second conductive pattern inside the second insulating layer, and a first recess formed on a first surface of the interposer that faces the first semiconductor chip;

a first element disposed inside the first recess and bonded to the interposer, wherein the first element faces the first semiconductor chip; and a mold layer that fills the first recess and integrally covers a side of the first element, wherein the interposer further includes a second recess formed along a surface of a protrusion that protrudes from the first surface of the interposer.

20. The semiconductor package of claim 19, wherein the second recess has a sidewall that protrudes from the first surface, and a bottom surface connected with the sidewall, and the mold layer is filled between the sidewall and the bottom surface.

\* \* \* \* \*